US010777623B2

(12) United States Patent
Rhee et al.

(10) Patent No.: US 10,777,623 B2
(45) Date of Patent: Sep. 15, 2020

(54) ELECTRONIC DEVICE INCLUDING DISPLAY WITH EXPANDED SENSOR OPERABILITY

(71) Applicant: Samsung Electronics Co., Ltd., Gyeonggi-do (KR)

(72) Inventors: Bong Jae Rhee, Gyeonggi-do (KR); Song Hee Jung, Gyeonggi-do (KR); Hyun Chang Shin, Gyeonggi-do (KR); Hyun Woo Kim, Gyeongsangbuk-do (KR); Ji Hoon Park, Gyeonggi-do (KR); Ji Hun Heo, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/983,562

(22) Filed: May 18, 2018

(65) Prior Publication Data
US 2018/0337219 A1  Nov. 22, 2018

(30) Foreign Application Priority Data

May 18, 2017  (KR) .......................... 10-2017-0061898

(51) Int. Cl.
| H01L 29/04 | (2006.01) |
| H01L 27/14 | (2006.01) |
| H01L 31/036 | (2006.01) |
| H01L 27/32 | (2006.01) |

(Continued)

(52) U.S. Cl.
CPC ........ H01L 27/3232 (2013.01); G02B 5/3025 (2013.01); G02B 5/3083 (2013.01); H01L 27/3244 (2013.01); H01L 51/5281 (2013.01); H01L 27/3227 (2013.01)

(58) Field of Classification Search
CPC ...... G02B 5/3025; G02B 5/3083; G02B 5/30; H01L 27/3227; H01L 27/3232; H01L 27/3244; H01L 51/5281
See application file for complete search history.

(56) References Cited

U.S. PATENT DOCUMENTS

| 9,143,668 B2 | 9/2015 | Mathew et al. |
| 9,336,428 B2 | 5/2016 | Erhart |
| 9,400,911 B2 | 7/2016 | Erhart et al. |

(Continued)

FOREIGN PATENT DOCUMENTS

| KR | 1020140098310 | 8/2014 |
| KR | 1020170038594 | 4/2017 |

OTHER PUBLICATIONS

International Search Report dated Sep. 10, 2018 issued in counterpart application No. PCT/KR2018/005753, 10 pages.

*Primary Examiner* — Meiya Li
(74) *Attorney, Agent, or Firm* — The Farrell Law Firm, P.C.

(57) ABSTRACT

Disclosed is an electronic device including a housing, a display panel, and an image sensor. The display panel includes a first polarization layer that causes light input from outside the electronic device to oscillate in a first direction as a first linearly-polarized light, a first retardation layer disposed below the first polarization layer and causing at least a portion of the first linearly-polarized light to oscillate as a circularly-polarized light, a substrate layer disposed below the first retardation layer and passing at least a portion of the circularly-polarized light, and a protection layer disposed below the substrate layer and protecting at least a portion of the substrate layer by covering the portion of the substrate layer.

20 Claims, 14 Drawing Sheets

(51) Int. Cl.
*G02B 5/30* (2006.01)
*H01L 51/52* (2006.01)

(56) References Cited

U.S. PATENT DOCUMENTS

| | | |
|---|---|---|
| 9,632,344 B2 | 4/2017 | Ludwig |
| 9,709,844 B2 | 7/2017 | Yim et al. |
| 2011/0102567 A1 | 5/2011 | Erhart |
| 2011/0102569 A1 | 5/2011 | Erhart |
| 2011/0267298 A1 | 11/2011 | Erhart et al. |
| 2012/0105400 A1 | 5/2012 | Mathew et al. |
| 2013/0002994 A1 | 1/2013 | Wang et al. |
| 2013/0314647 A1 | 11/2013 | Yim et al. |
| 2014/0036168 A1 | 2/2014 | Ludwig |
| 2016/0212311 A1 | 7/2016 | Mathew et al. |
| 2017/0045918 A1 | 2/2017 | Han et al. |
| 2017/0220145 A1 | 8/2017 | Ludwig |

ELECTRONIC DEVICE INCLUDING DISPLAY WITH EXPANDED SENSOR OPERABILITY

CROSS-REFERENCE TO RELATED APPLICATION(S)

This application is based on and claims priority under 35 U.S.C. § 119 to Korean Patent Application No. 10-2017-0061898, filed on May 18, 2017, in the Korean Intellectual Property Office, the disclosure of which is incorporated by reference herein in its entirety.

BACKGROUND

1. Field

The disclosure relates generally to an electronic device, and more particularly, to an electronic device including a display with expanded sensor operability.

2. Description of Related Art

Mobile electronic devices, such as smartphones, tablet personal computers (PCs) and wearable devices have become been widely used in recent times. These electronic devices may perform various functions, such as telephone call, wireless communication, video reproduction, and Web searching functions. In recent years, various attempts have been made to reduce a bezel area around a display to provide a large display to a user while reducing the weight of an electronic device. In the conventional art, a display of an electronic device may be expanded to a side edge region, or a front button may be removed, to increase an active area of the display and reduce a bezel area (or an inactive area). However, the active area of the display is conventionally limited since the electronic device needs the bezel area on the front surface thereof for various types of sensors, such as, such as proximity, illuminance, camera module, iris, and fingerprint sensors.

As such, there is a need in the art for an electronic device display which enhances the operability of the active area, thereby enabling a user to more conveniently manipulate the electronic device and for the functions thereof to be better realized.

SUMMARY

Aspects of the present disclosure are to address at least the above-mentioned problems and/or disadvantages and to provide at least the advantages described below. Accordingly, an aspect of the present disclosure is to provide an electronic device that has a sensor on an inner surface of the display panel and improves the efficiency of the sensor in receiving light and the visibility of the sensor.

According to another aspect of the disclosure, by replacing a protection film inside a display panel of an electronic device with a material for enhancing optical characteristics, the ability of a sensor to receive light is enhanced.

According to another aspect of the disclosure, light input from the outside is prevented from being reflected by an element, such as a sensor, inside the display panel and then leaked to the outside. Accordingly, a full-front display may be mounted on the electronic device.

According to another aspect of the disclosure, light generated by the display panel is prevented from being reflected inside the electronic device and then leaked to the outside, thereby improving visibility to prevent a user from recognizing the position of the sensor inside the display panel.

According to embodiments of the disclosure, an electronic device includes a housing, a display panel having at least a portion exposed through the housing, and an image sensor disposed adjacent to an inner surface of the display panel. The display panel includes a first polarization layer configured to cause light input from outside the electronic device to oscillate in a first direction as first linearly-polarized light, a first retardation layer disposed below the first polarization layer and configured to cause at least a portion of the first linearly-polarized light to oscillate as circularly-polarized light, a substrate layer disposed below the first retardation layer and configured to pass at least a portion of the circularly-polarized light, and a protection layer disposed below the substrate layer and configured to protect at least a portion of the substrate layer by covering the at least a portion of the substrate layer, wherein the protection layer causes the circularly-polarized light and reflected light generated by reflection of at least a portion of the circularly-polarized light on a surface of the image sensor to be in a substantially identical phase.

According to embodiments of the disclosure, an electronic device includes a housing, a display panel having at least a portion exposed through the housing, and an image sensor disposed adjacent to an inner surface of the display panel, wherein the display panel includes a first polarization layer configured to cause light input from outside the electronic device to oscillate in a first direction as first linearly-polarized light, a first retardation layer disposed below the first polarization layer and configured to cause at least a portion of the first linearly-polarized light to oscillate as first circularly-polarized light, a substrate layer disposed below the first retardation layer and configured to pass at least a portion of the first circularly-polarized light, and a protection layer disposed below the substrate layer and configured to protect at least a portion of the substrate layer by covering the at least a portion of the substrate layer, wherein the protection layer causes the first circularly-polarized light and second circularly-polarized light having passed through the protection layer to be in a substantially identical phase.

According to embodiments of the disclosure, an electronic device includes a housing, a display panel having at least a portion exposed through the housing; and an image sensor disposed adjacent to an inner surface of the display panel, wherein the display panel includes a first polarization layer configured to cause light input from outside the electronic device to oscillate in a first direction as first linearly-polarized light, a first retardation layer disposed below the first polarization layer and configured to cause at least a portion of the first linearly-polarized light to oscillate as circularly-polarized light, a substrate layer disposed below the first retardation layer and configured to pass at least a portion of the circularly-polarized light, and a protection layer disposed below the substrate layer and configured to protect at least a portion of the substrate layer by covering the at least a portion of the substrate layer, wherein the protection layer causes the circularly-polarized light and reflected light generated by reflection of at least a portion of the circularly-polarized light on a surface of the image sensor to rotate in different directions.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
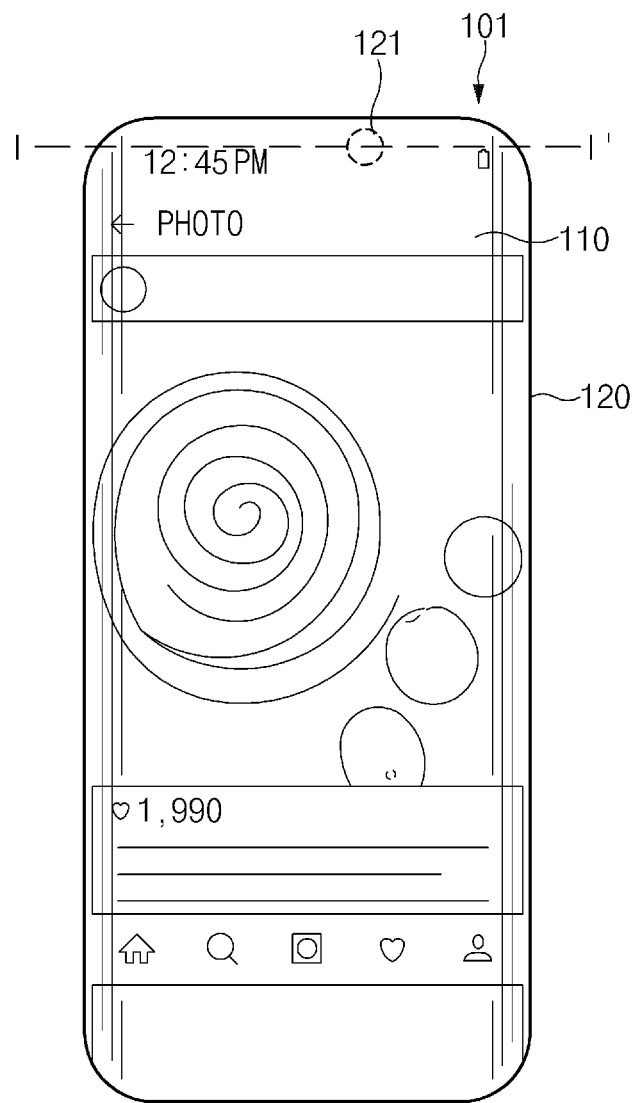
FIG. 1 illustrates an external configuration of an electronic device according to an embodiment.

Embodiments of the present disclosure will now be described with reference to the accompanying drawings. Those of ordinary skill in the art will recognize that modifications, equivalents, and/or alternatives to the embodiments described herein can be variously made without departing from the scope and spirit of the present disclosure. With regard to description of drawings, similar components may be marked by similar reference numerals.

Herein, the expressions "have", "may have", "include" and "comprise", or "may include" and "may comprise" may indicate existence of corresponding elements, such as numeric values, functions, operations, or components, but do not exclude presence of additional elements.

In the disclosure, the expressions "A or B", "at least one of A or/and B", or "one or more of A or/and B" may include any and all combinations of one or more of the associated listed items. For example, "A or B", "at least one of A and B", or "at least one of A or B" may refer to any of when at least one A is included, when at least one B is included, and when both of at least one A and at least one B are included.

Terms such as "first" and "second" used herein may refer to various elements of the present disclosure, but do not limit the elements. For example, such terms are used only to distinguish an element from another element and do not limit the order and/or priority of the elements. A first user device and a second user device may represent different user devices irrespective of sequence or importance, a first element may be referred to as a second element, and similarly, a second element may be referred to as a first element.

It will be understood that when the first element is referred to as being "(operatively or communicatively) coupled with/to" or "connected to" another element, such as the second element, the first element can be directly coupled with/to or connected to the second element or an intervening third element may be present. In contrast, when the first element is referred to as being "directly coupled with/to" or "directly connected to" the second element, there is no intervening third element.

According to the situation, the expression "configured to" used herein may be used as any of the expressions "suitable for", "having the capacity to", "designed to", "adapted to", "made to", and "capable of". The expression "configured to (or set to)" may indicate "specifically designed to" in hardware, and the expression "a device configured to" may indicate that the device is "capable of" operating together with another device or other components. A "processor configured to (or set to) perform A, B, and C" may indicate a dedicated processor for performing a corresponding operation or a generic-purpose processor (for example, a central processing unit (CPU) or an application processor (AP)) which may perform corresponding operations by executing one or more software programs stored in a memory device.

Terms in this specification are used to describe specified embodiments of the present disclosure and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal manner unless expressly so defined herein. In some cases, even terms which are defined in the specification may not be interpreted to exclude embodiments of the present disclosure.

An electronic device according to various embodiments may include at least one of smartphones, tablet PCs, mobile phones, video telephones, electronic book readers, desktop PCs, laptop PCs, netbook computers, workstations, servers, personal digital assistants (PDAs), portable multimedia players (PMPs), motion pictures experts group (MPEG) audio layer 3 (MP3) players, mobile medical devices, cameras, and wearable devices including accessories, such as watches, rings, bracelets, ankle bracelets, glasses, contact lenses, or head-mounted devices (HMDs), electronic clothes, body-attached types (for example, skin pads or tattoos), and implantable circuits.

Hereinafter, the term "user" used herein may refer to a person who uses an electronic device or to an artificial intelligence electronic device that uses an electronic device.

FIG. 1 illustrates an external configuration of an electronic device according to an embodiment.

Referring to FIG. 1, an electronic device 101 may include a display panel (a display or a display module) 110 and a main body (or a housing) 120.

The display panel 110 may include a liquid crystal display (LCD), a light-emitting diode (LED) display, an organic LED (OLED) display, a microelectromechanical systems (MEMS) display, or an electronic paper display. The display panel 110 may display various types of contents, such as text, images, videos, icons, and symbols, to a user, may include a touch screen and may receive a touch, gesture, proximity, or hovering input using an electronic pen or a part of the user's body, and may include a glass cover exposed to the outside and various layers inside. Additional information about an internal configuration of the display panel 110 may be provided through FIGS. 2A to 9.

According to various embodiments, the display panel 110 may be mounted to occupy the entirety or most of a first surface, such as a front surface, of the electronic device 101. In this case, a bezel area around the display panel 110 may be minimized or removed. For example, the display panel 110 may also output contents in an area (hereinafter, referred to as a sensing area) 121 where a camera module or a sensor is mounted. Alternatively, an edge display of the display panel 110 may be expanded to a side region of the electronic device 101.

The display panel 110 may be mounted on the main body 120, which may include various elements, such as a processor, a communication circuit, a battery, and a printed circuit board (PCB), for driving the electronic device 101.

According to various embodiments, the entirety or greater part of a front surface of the main body 120, on which the display panel 110 is mounted, may be an active area of the display panel 110 in which contents are output. While FIG. 1 illustrates that the sensing area 121 is disposed on an upper side of the electronic device 101, the sensing area 121 is not limited thereto, and may be formed on a lower side of the electronic device 101 or in the center of the display panel 110.

When receiving light input from the outside through the sensing area (or open area) 121, the electronic device 101 may block reflected light to prevent the user from recognizing the position of the sensing area 121. Various sensors may be disposed inward of the sensing area 121. Additional information about receiving or reflecting light in the sensing area 121 may be provided through FIGS. 2A to 6B.

Although it will be described that a sensor is disposed inward of the sensing area 121, the present disclosure is not limited thereto, and may be applied even when a non-uniform element is disposed on an inner surface of the display panel 110.

Figure 2A:
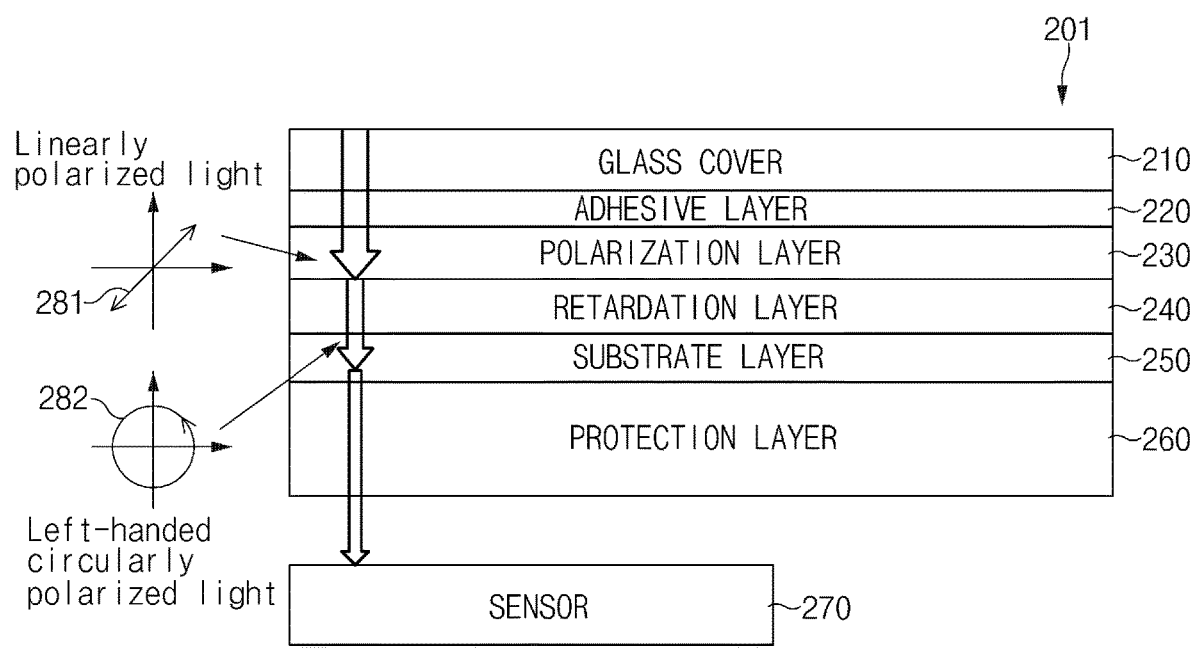
FIGS. 2A and 2B illustrate a sectional view of a display panel according to an embodiment.
Figure 2B:
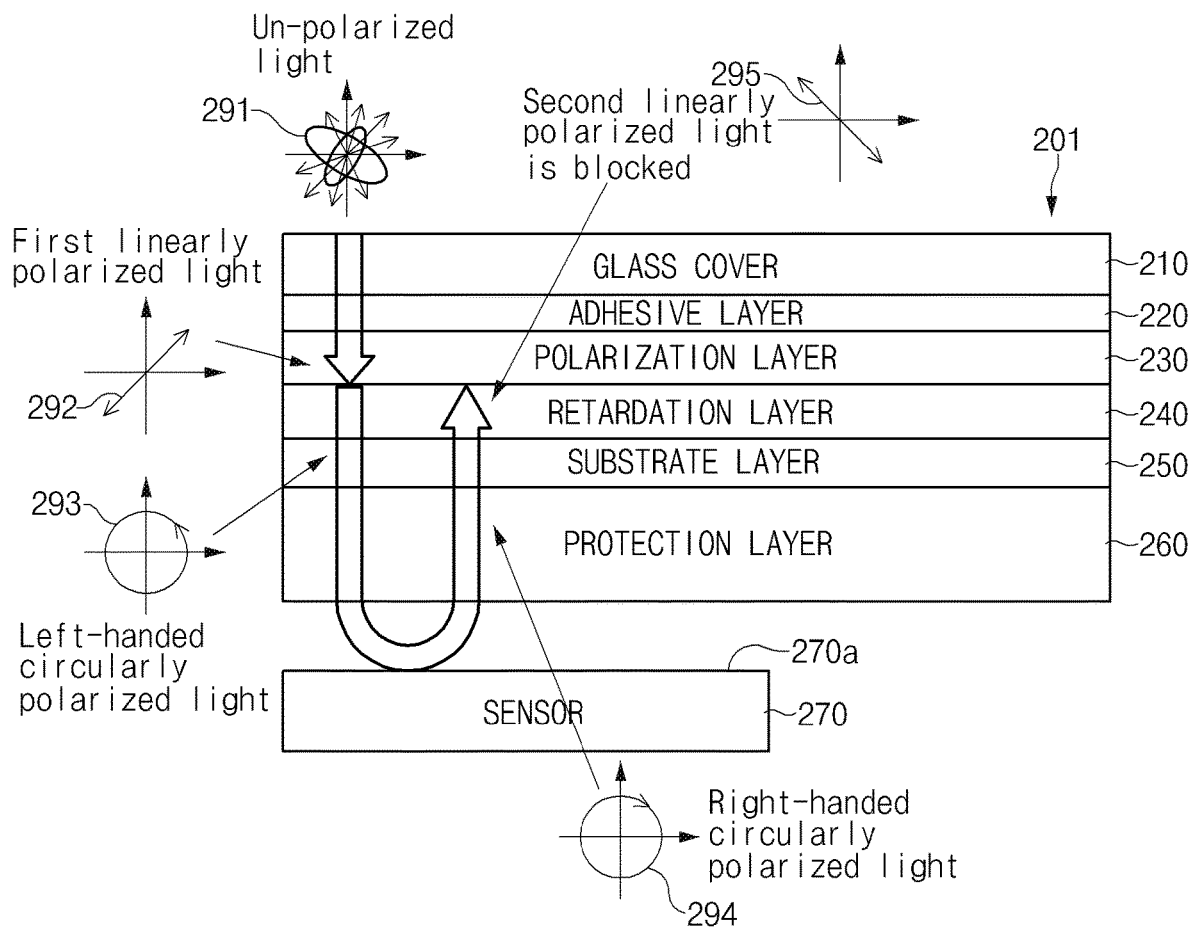

FIGS. 2A and 2B illustrate a sectional view of a display panel taken along line I-I' of FIG. 1 according to an embodiment. Referring to FIGS. 2A and 2B, the display panel 201 may include a glass cover 210, an adhesive layer 220, a polarization layer 230, a retardation layer 240, a substrate layer (or an emissive layer) 250, and a protection layer 260. A sensor 270 may be disposed on an inner surface of the display panel 201 facing away from a surface of the display panel 201 on which contents are output, and may collect light input from the outside to collect sensed data and manage the sensors.

According to various embodiments, the display panel 201 may further include a touch panel that may be disposed between the glass cover 210 and the polarization layer 230. Alternatively, the touch panel may be disposed between the polarization layer 230 and the substrate layer 250, may be integrally formed with the substrate layer 250, may recognize a user's touch, and may be implemented with an indium-tin-oxide (ITO) film, a silver nanowire, or a metal mesh.

The glass cover 210 may be disposed at the top of the display panel 110, and may protect elements inside the display panel 110. Light generated by the substrate layer 250 may be output to the outside through the glass cover 210.

The adhesive layer 220 may stick the glass cover 210 to the polarization layer 230, and may be implemented with an optically clear adhesive (OCA) film (a double-sided adhesive tape).

The polarization layer 230 may polarize light input from the outside, may pass light having an electric field that oscillates along a specified linear path, and may block light that is not in agreement with the specified linear path.

When linearly polarized light is input to the retardation layer (or retarder layer) 240, the retardation layer 240 may convert the linearly polarized light into light rotating along a circular path. When circularly polarized light is input to the retardation layer 240, the retardation layer 240 may convert the circularly polarized light into linearly polarized light and may have a characteristic of a quarter wave retarder (a $\lambda/4$ retarder).

The substrate layer (or emissive layer) 250 may emit light depending on an electrical signal and may have light-emitting devices, such as organic electro luminescence (EL), deposited on a thin film transistor (TFT) substrate that may include TFT devices for driving respective pixels in an active area, metal interconnection wiring, or an insulation film. The organic EL may emit light with holes and electrons injected into the organic EL from a cathode and an anode.

According to embodiments, when light transmitted through the substrate 250 has a phase difference, the protection layer 260 disposed below the substrate layer 250 may compensate for the phase difference to reduce a change in the phase difference.

The protection layer 260 may be a film layer for protecting the substrate layer 250 and may prevent the substrate layer 250 from colliding with elements inside the electronic device 101 by covering the substrate layer 250.

According to an embodiment, the protection layer 260 may be implemented with an isotropic film that may enable light having passed through the substrate layer 250 to be transmitted to the sensor 270 while maintaining optical characteristics thereof. For example, the isotropic film may be implemented with a cyclo olefin polymer (COF), tri-acetyl cellulose (TAC), or zero acryl.

According to another embodiment, the protection layer 260 may be implemented with an anisotropic film with specified optical characteristics. For example, the protection layer 260 may have such a thickness as to cause incident light to have a phase lag of $(n/2) \times \lambda$ (n is a natural number and $\lambda$ is a wavelength) depending on material characteristics of an anisotropic film.

According to various embodiments, the display panel 201 may further include a back cover disposed in at least a partial area below the protection layer 260 and supporting and protecting the display panel 201. The back cover may prevent light input from the outside, light input from the substrate layer 250, or electromagnetic waves from being introduced into the electronic device 101, may include a black film and a metal plate, such as copper, and may be at least partly open to enable light to be transmitted to the sensor 270.

FIG. 2A illustrates a change in characteristics of light input from the outside in a process in which the light passes through the display panel 201 and reaches the sensor 270, according to an embodiment.

Referring to FIG. 2A, light input from the outside may pass through the polarization layer 230 to change into linearly polarized light 281, which may be input to the retardation layer 240.

The linearly polarized light 281 may pass through the retardation layer 240 to change into circularly polarized light 282 having a characteristic of a first direction, such as left-handed circularly polarized light. For example, the retardation layer 240 may have a characteristic of a quarter wave retarder (a $\lambda/4$ retarder), which may cause the linearly polarized light 281 to have a phase lag of $\lambda/4$ to generate the circularly polarized light 282.

The circularly polarized light 282 may be directed toward the sensor 270 through the protection layer 260 while maintaining optical characteristics of the sensor 270. For example, when the protection layer 260 is an isotropic film, the circularly polarized light 282 may be directed toward a light-receiving part of the sensor 270 without a phase change (or with a phase difference in a specified range, such as below about 20 nm). In another example, when the protection layer 260 is an anisotropic film, the circularly polarized light 282 may be directed toward the light-receiving part of the sensor 270 with a phase change of a multiple of one-half wavelength ($(n/2) \times \lambda$).

FIG. 2B illustrates a change in characteristics of light input from the outside when the light is reflected by the sensor 270, according to an embodiment.

Referring to FIG. 2B, incident light 291 input from the outside may scatter in various directions and may pass through the polarization layer 230 to change into first linearly polarized light 292.

The first linearly polarized light 292 may pass through the retardation layer 240 to change into circularly polarized light 293 having a characteristic of the first direction, such as left-handed circularly polarized light.

The circularly polarized light 293 may reach an outer surface 270a of the sensor 270 through the protection layer 260 while maintaining optical characteristics thereof. For example, when the protection layer 260 is an isotropic film, the circularly polarized light 293 may reach the outer surface 270a of the sensor 270 without a phase change (or with a phase difference in a specified range, such as below about 20 nm).

The circularly polarized light 293 may be reflected by the outer surface 270a of the sensor 270 to change into reflected light 294 having a characteristic of a second direction, such as right-handed circularly polarized light, unlike the direction of the circularly polarized light 293, and may pass through the protection layer 260 and the substrate layer 250 again and may be input to the retardation layer 240.

When the reflected light 294 is input to the retardation layer 240, the reflected light 294 may change into second linearly polarized light 295 that may have a different oscillating path than the first linearly polarized light 292. Accordingly, when input to the polarization layer 230, the second linearly polarized light 295 may be blocked by the polarization layer 230 and thus is prevented from leaking.

When the reflected light 294 reflected by the sensor 270 leaks out of the glass cover 210, a user may recognize the position where the sensor 270 is located. In this case, displayed contents (an image or text) and the shape of the sensor 270 may overlap each other, which is an inconvenience when using the electronic device 101. The protection layer 260 having a specified light transmission characteristic may remove or reduce a phase change of the reflected light 294, thereby decreasing the possibility that the reflected light 294 leaks out.

Figure 3A:
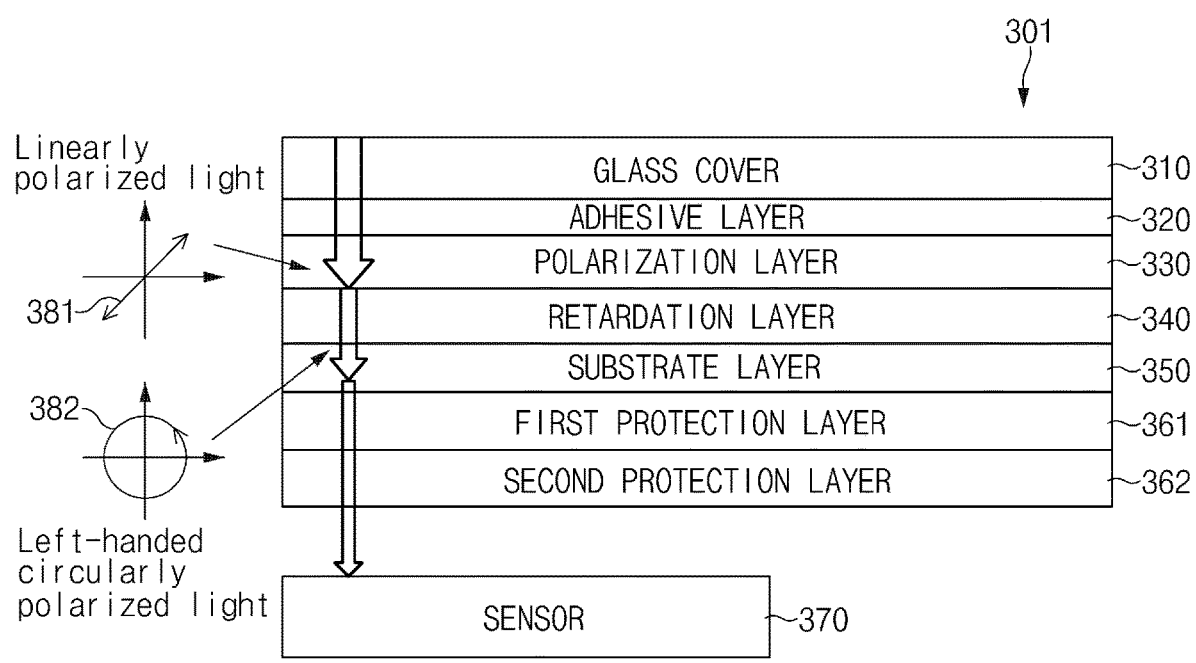
FIGS. 3A and 3B illustrate a display panel including a plurality of protection layers according to an embodiment.
Figure 3B:
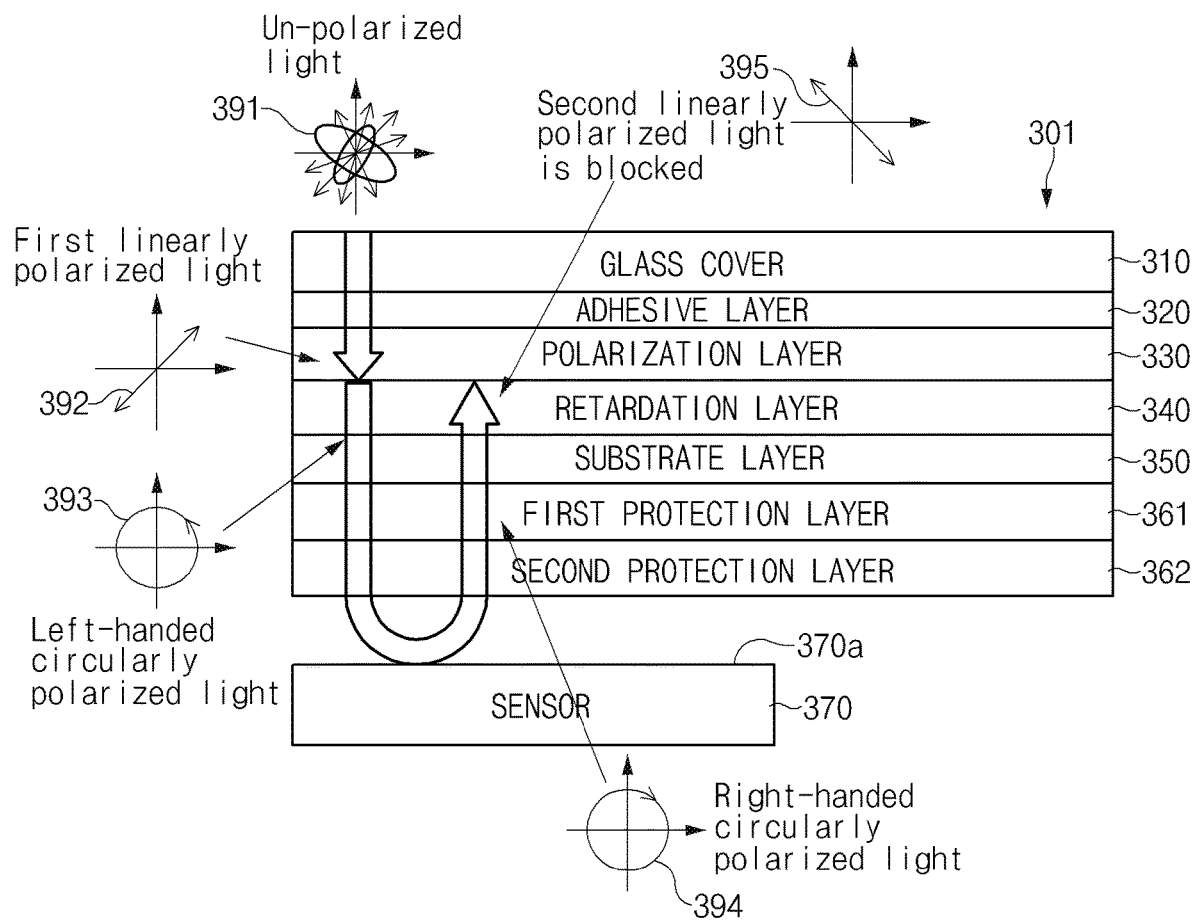

FIGS. 3A and 3B illustrate a display panel including a plurality of protection layers according to an embodiment. A display panel 301 may be a form of the display panel 110 illustrated in FIG. 1. While FIGS. 3A and 3B illustrate that two protection layers 361 and 362 are included in the display panel 301, the present disclosure is not limited thereto.

Referring to FIGS. 3A and 3B, the display panel 301 may include a glass cover 310, an adhesive layer 320, a polarization layer 330, a retardation layer 340, a substrate layer (or an emissive layer) 350, the first protection layer 361, and the second protection layer 362, all of which having characteristics the same as, or similar to, those of the corresponding elements of FIGS. 2A and 2B.

According to various embodiments, the first protection layer 361 and the second protection layer 362 may have different optical characteristics. For example, the first protection layer 361 may be an isotropic film, and the second protection layer 362 may be an anisotropic film. In this case, the second protection layer 362 may compensate for a phase change of light caused by material characteristics of the isotropic film, thereby minimizing a phase change of light passing through the first protection layer 361 and the second protection layer 362.

In another example, the first protection layer 361 and the second protection layer 362 may be anisotropic films having different optical characteristics. Light passing through the first protection layer 361 and the second protection layer 362 may have no phase change, or may have a phase change of a multiple of one-half wavelength ($(n/2) \times \lambda$).

According to various embodiments, the first protection layer 361 and the second protection layer 362 may compensate for a phase change of light that is likely to occur in the substrate layer 350, thereby minimizing a phase change of light passing through the display panel 301.

FIG. 3A illustrates a change in characteristics of light input from the outside in a process in which the light passes through the display panel 301 and reaches a sensor 370, according to an embodiment.

Referring to FIG. 3A, light input from the outside may pass through the polarization layer 330 to change into linearly polarized light 381.

The linearly polarized light 381 may pass through the retardation layer 340 to change into circularly polarized light 382 having a characteristic of the first direction, such as left-handed circularly polarized light.

The circularly polarized light 382 may be directed toward the sensor 370 through the first protection layer 361 and the second protection layer 362 while maintaining optical characteristics thereof. For example, the circularly polarized light 382 may pass through the first protection layer 361 and the second protection layer 362 and may be directed toward a light-receiving part of the sensor 370 without a phase change (or with a phase difference in the specified range, such as below about 20 nm). In another example, the circularly polarized light 382 may pass through the first protection layer 361 and the second protection layer 362 and may be directed toward the light-receiving part of the sensor 370 with a phase change of a multiple of one-half wavelength ($(n/2) \times \lambda$).

FIG. 3B illustrates a change in characteristics of external light when the external light is reflected by the sensor 370, according to an embodiment.

Referring to FIG. 3B, incident light 391 input from the outside may scatter in various directions and may pass through the polarization layer 330 to change into first linearly polarized light 392.

The first linearly polarized light 392 may pass through the retardation layer 340 to change into circularly polarized light 393 having a characteristic of the first direction.

The circularly polarized light 393 may reach an outer surface 370a of the sensor 370 through the first protection layer 361 and the second protection layer 362 while maintaining optical characteristics thereof. For example, the circularly polarized light 393 may reach the outer surface 370a of the sensor 370 without a phase change (or with a phase difference in the specified range.

The circularly polarized light 393 may be reflected by the outer surface 370a of the sensor 370 to change into reflected light 394 having a characteristic of the second direction, such as right-handed circularly polarized light, unlike the left-handed direction of the circularly polarized light 393. The reflected light 394 may pass through the first protection layer 361, the second protection layer 362, and the substrate layer 350 again and may be input to the retardation layer 340.

When the reflected light 394 is input to the retardation layer 340, the reflected light 394 may change into second linearly polarized light 395 which may have a different oscillating path than the first linearly polarized light 392. Accordingly, when input to the polarization layer 330, the second linearly polarized light 395 may be blocked by the polarization layer 330 and thus is prevented from leaking.

The first protection layer 361 and the second protection layer 362 may remove a phase change of the reflected light 394, or may cause a phase change of a multiple of one-half wavelength ($(n/2) \times \lambda$), to lower the possibility that the reflected light 394 leaks out.

Figure 4A:
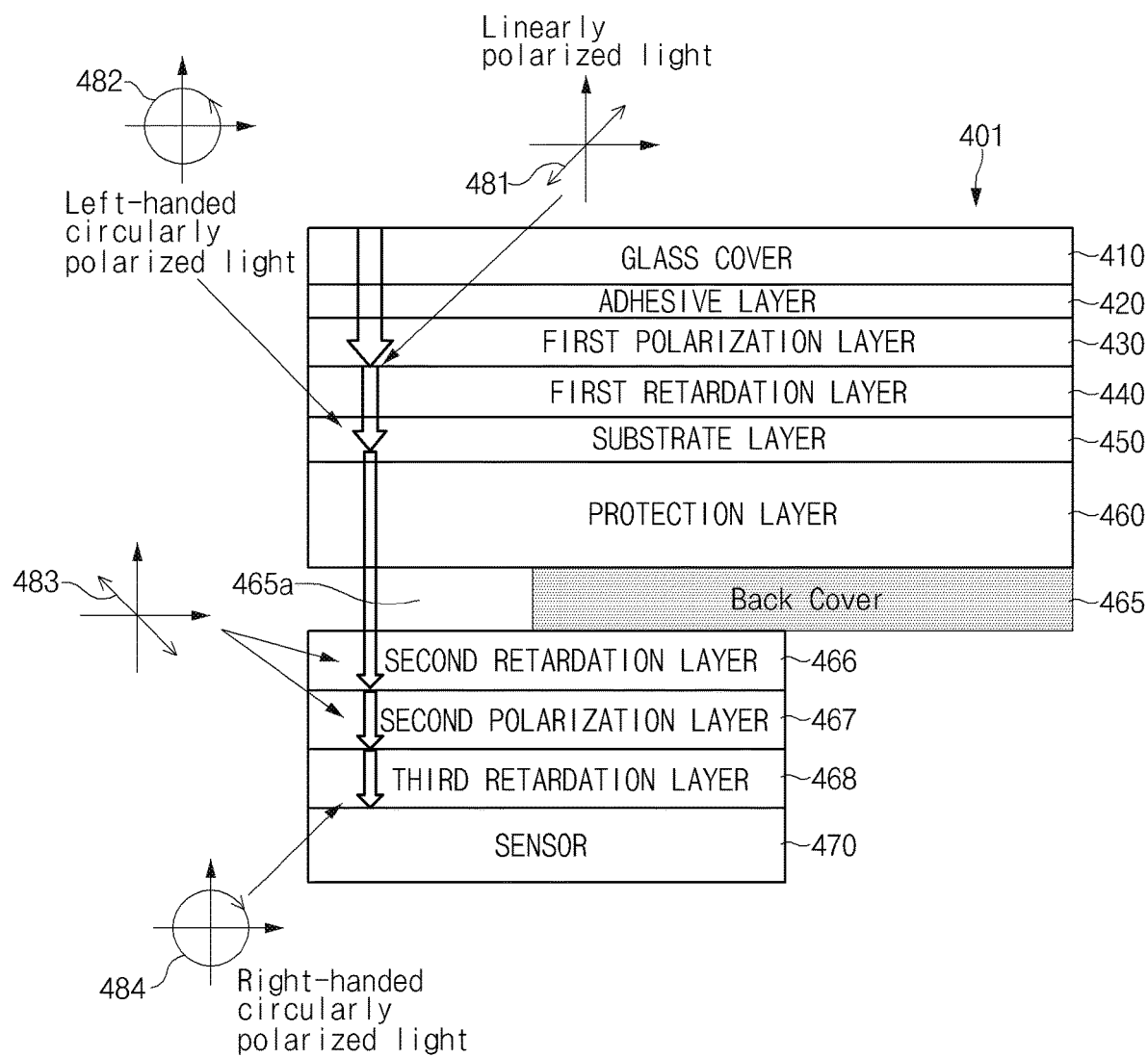
FIGS. 4A and 4B illustrate a display panel additionally including a polarization layer and a retardation layer on a top surface of a sensor according to an embodiment.
Figure 4B:
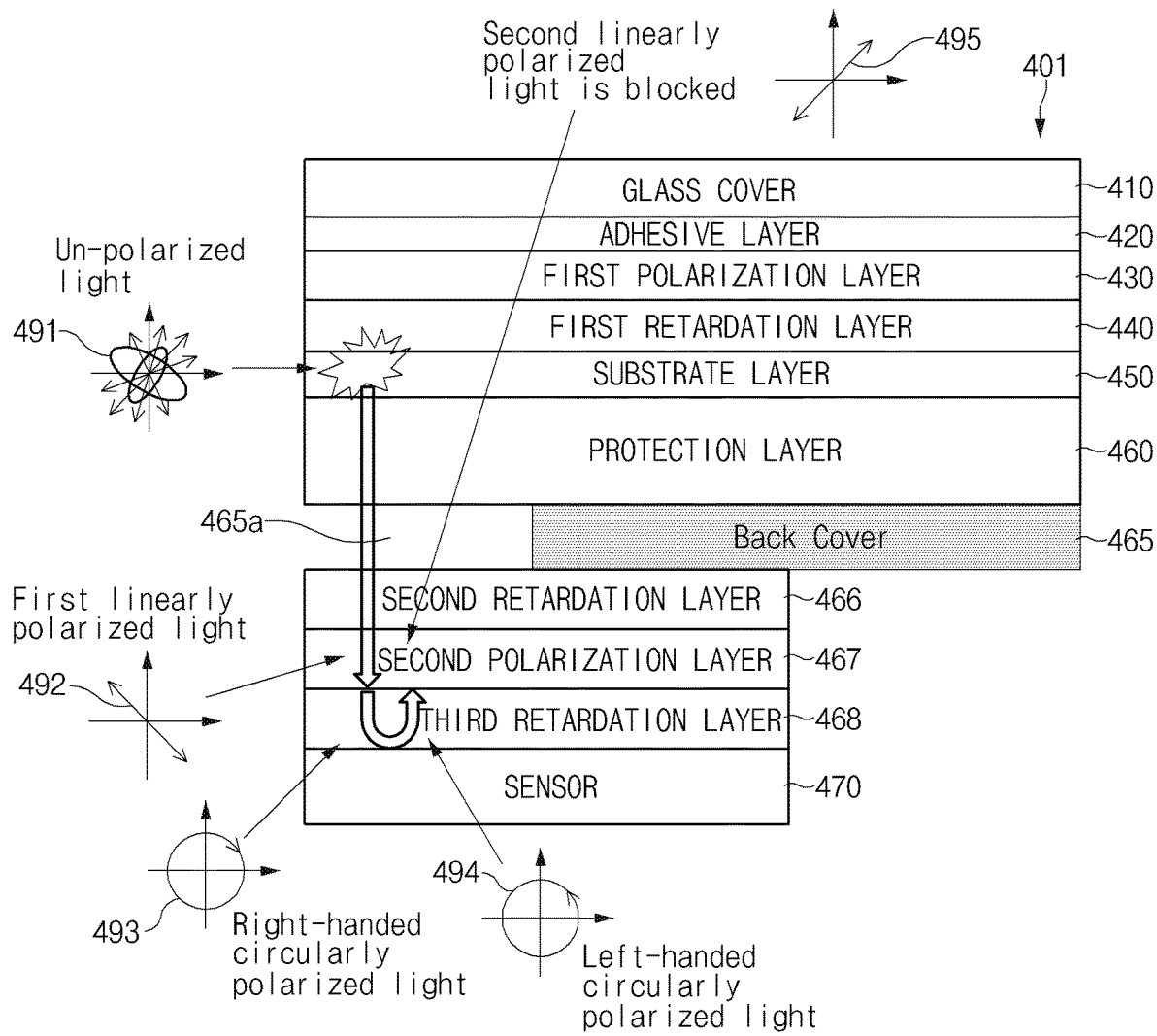

FIGS. 4A and 4B illustrate a display panel additionally including a polarization layer and a retardation layer on a top surface of a sensor according to an embodiment. Referring to FIGS. 4A and 4B, the display panel 401 may include a glass cover 410, an adhesive layer 420, a first polarization layer 430, a first retardation layer 440, a substrate layer (or an emissive layer) 450, a protection layer 460, and a back cover 465, each having characteristics that may be the same as, or similar to, those of the corresponding elements of FIGS. 2A and 2B.

The back cover 465 may support and protect the display panel 401, may prevent light input from the outside, light generated by the substrate layer 450, or electromagnetic waves from being introduced into the electronic device 101, and may include a black film and a metal plate, such as copper, and may be separately implemented without being included in the display panel 401.

The back cover 465 may be disposed to cover a portion of the top of a sensor 470 and to open an open area 465a. The sensor 470 may collect sensed data by using light input through the open area 465a. The back cover 465 may be implemented to open the entire top surface of the sensor 470.

While FIGS. 4A and 4B illustrate that the back cover 465 is disposed on the bottom of the protection layer 460, the back cover 465 is not limited thereto, and may be disposed between layers that are disposed between the substrate layer 450 and the sensor 470. For example, the back cover 465 may be disposed between a third retardation layer 468 and the sensor 470.

The display panel 401 may further include a second retardation layer 466, a second polarization layer 467, and the third retardation layer 468 on the top surface of the sensor 470 (the surface facing the back cover 465). The second retardation layer 466 and the third retardation layer 468 may have the same optical characteristics as the first retardation layer 440. The second polarization layer 467 may have the same optical characteristics as the first polarization layer 430. The second polarization layer 467 and the third retardation layer 468 may block light generated by the substrate layer 450 and reflected by a surface of the sensor 470.

The second retardation layer 466 and the third retardation layer 468 may have a characteristic of a quarter wave retarder (a $\lambda/4$ retarder). The second retardation layer 466 may cause a phase change of $(1+4n) \times \lambda/4$ (n is a natural number and $\lambda$ is a wavelength), and the third retardation layer 468 may cause a phase change of $(1+2n) \times \lambda/4$ (n is a natural number and $\lambda$ is a wavelength).

FIG. 4A illustrates a change in characteristics of light input from the outside in a process in which the light passes through the display panel 401 and reaches the sensor 470, according to an embodiment.

Referring to FIG. 4A, light input from the outside may pass through the polarization layer 430 to change into linearly polarized light 481 that may pass through the first retardation layer 440 to change into circularly polarized light 482 having a characteristic of the first direction, such as left-handed circularly polarized light. While FIG. 4A illustrates that the circularly polarized light 482 is left-handed circularly polarized light, the circularly polarized light 482 may also be right-handed circularly polarized light. The circularly polarized light 482 may be absorbed into an area hidden by the back cover 465.

In the open area 465a not being hidden by the back cover 465, the circularly polarized light 482 may be directed toward the sensor 470 through the protection layer 460 while maintaining optical characteristics thereof. For example, when the protection layer 460 is an isotropic film, the circularly polarized light 482 may be directed toward the second retardation layer 466 without a phase change (or with a phase difference in the specified range.

According to various embodiments, when the protection layer 460 is an isotropic film, the circularly polarized light 482 may be directed toward the second retardation layer 466 with a phase difference of $(n/2) \times \lambda$ (n is a natural number and $\lambda$ is a wavelength). When n is an odd number, the second retardation layer 466 and the third retardation layer 468 may maintain the same polarization direction. When n is an even number, the second retardation layer 466 and the third retardation layer 468 may maintain polarization directions that cross each other.

In another example, when the protection layer 460 is an anisotropic film, the circularly polarized light 482 may be directed toward the second retardation layer 466 with a phase change of a multiple of one-half wavelength ($(n/2) \times \lambda$).

The circularly polarized light 482 may change into linearly polarized light 483 through the second retardation layer 466 on the top surface of the sensor 470. The second retardation layer 466 may prevent the circularly polarized light 482 from being directly input to the second polarization layer 467, thereby preventing loss of light.

The linearly polarized light 483 may pass through the second polarization layer 467 without light loss. The linearly polarized light 483, may change into circularly polarized light 484 through the third retardation layer 468, and may be directed toward a light-receiving part of the sensor 470.

According to various embodiments, a portion of the circularly polarized light 484 may be reflected by a surface of the sensor 470. In this case, the reflected light generated by the reflection of the circularly polarized light 484 may be circularly polarized light having a characteristic of the right-handed direction, unlike the left-handed direction of the circularly polarized light 482. The reflected light may be re-input to the third retardation layer 468 and may change into linearly polarized light. The reflected light having passed through the third retardation layer 468 may be blocked when input to the second retardation layer 467.

FIG. 4B illustrates a change in characteristics of light generated by the substrate layer 450 when the light is reflected by the sensor 470, according to an embodiment.

Referring to FIG. 4B, back light 491 may be light generated by the substrate layer 450 and directed toward the sensor 470, may scatter in various directions, and may be absorbed into the back cover 465 in the area hidden by the back cover 465.

When the back light 491 is reflected by a surface of the sensor 470 and leaks out of the open area 465a not being hidden by the back cover 465, a user may recognize the position of the sensor 470 through the light leakage. To prevent this from occurring, the reflected light generated by the reflection of the back light 491 on the surface of the sensor 470 may be blocked by the second polarization layer 467 and the third retardation layer 468.

The back light 491 may pass through the second retardation layer 466 and the second polarization layer 467 to change into first linearly polarized light 492 that may pass through the third retardation layer 468 into circularly polarized light 493 having a characteristic of right-handed circularly polarized light.

The circularly polarized light 493 may be reflected by a surface of the sensor 470 to change into reflected light 494 that may have a characteristic of left-handed circularly polarized light, unlike the direction of the circularly polarized light 493.

The reflected light 494 may be re-input to the third retardation layer 468, and may change into second linearly polarized light 495 that may have a different oscillating path than the first linearly polarized light 492. Accordingly, the second linearly polarized light 495 may be blocked when input to the second polarization layer 467.

Figure 5A:
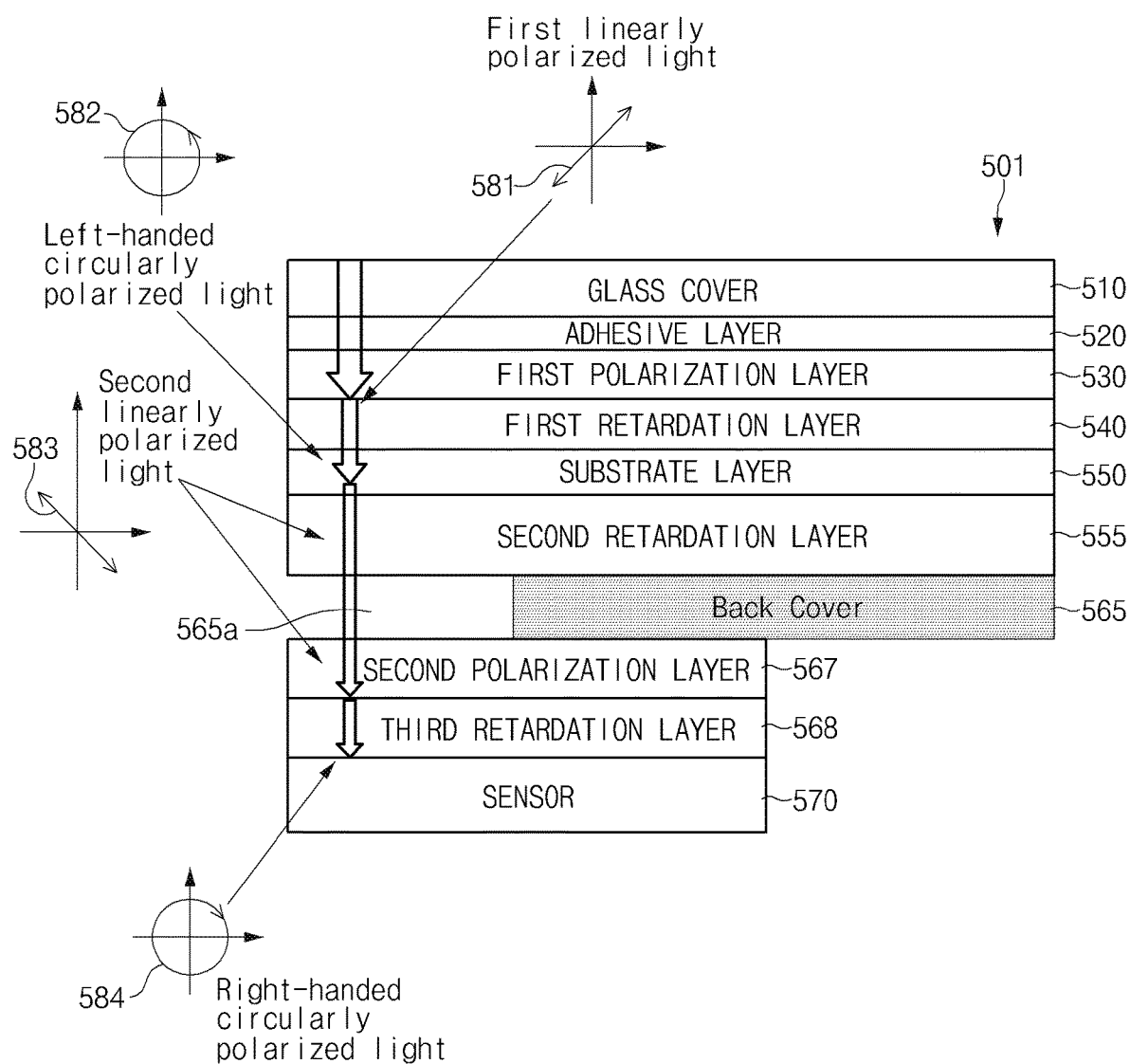
FIGS. 5A and 5B illustrate a display panel additionally including a polarization layer and a retardation layer between a substrate layer and a sensor according to an embodiment.
Figure 5B:
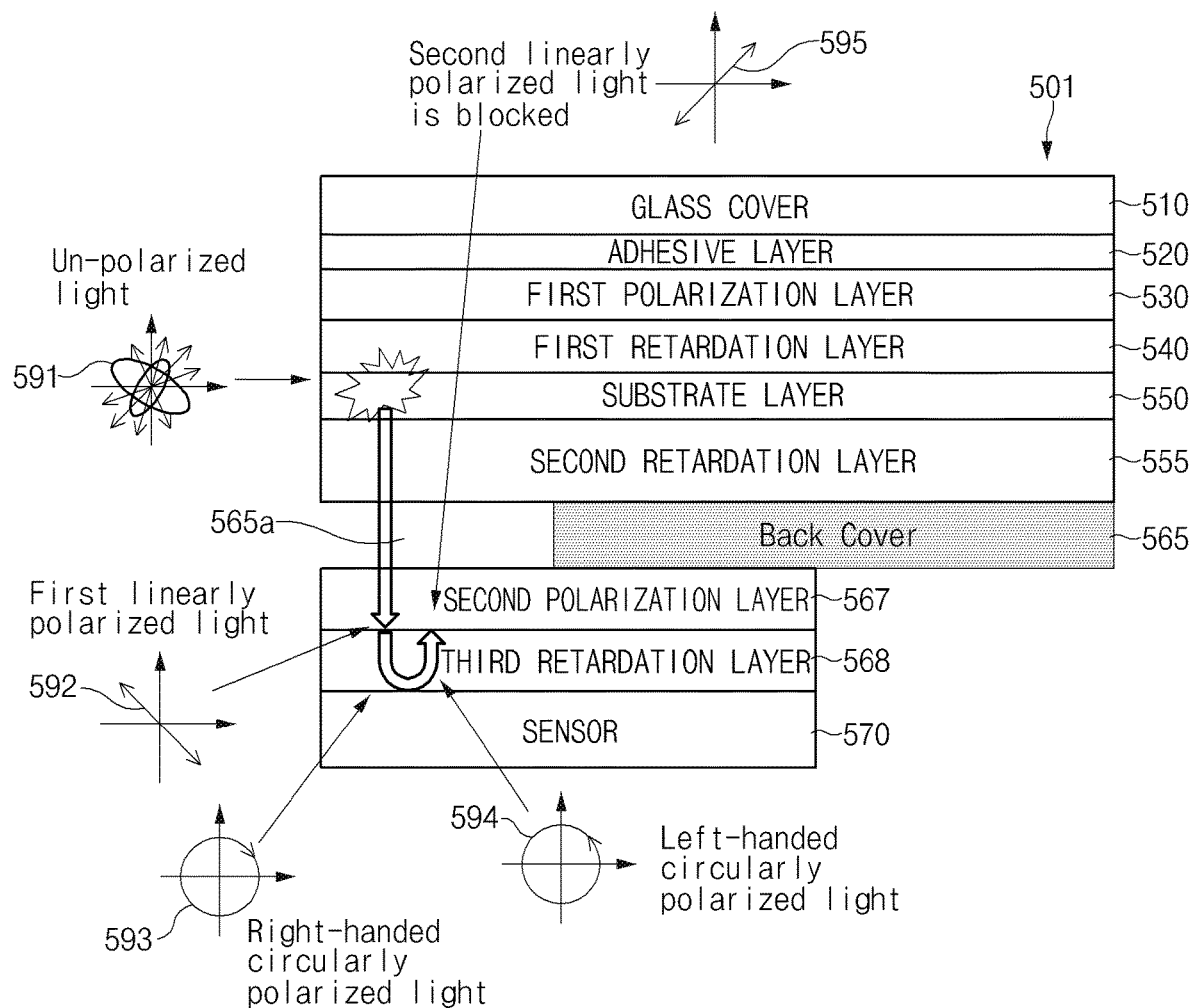

FIGS. 5A and 5B illustrate a display panel additionally including a polarization layer and a retardation layer between a substrate layer and a sensor according to an embodiment. Referring to FIGS. 5A and 5B, the display panel 501 may include a glass cover 510, an adhesive layer 520, a first polarization layer 530, a first retardation layer 540, a substrate layer (or an emissive layer) 550, a second retardation layer 555, and a back cover 565. Characteristics of the glass cover 510, the adhesive layer 520, the first polarization layer 530, the first retardation layer 540, and the substrate layer 550 may be the same as, or similar to, those of the corresponding elements of FIGS. 2A and 2B. Characteristics of the back cover 565 may be the same as, or similar to, those of the back cover 465 of FIGS. 4A and 4B.

Unlike the display panel 401 of FIGS. 4A and 4B, the display panel 501 may include the second retardation layer 555 between the substrate layer 550 and the back cover 565 and a third retardation layer 568 on a sensor 570. The display panel 501 may include a second polarization layer 567 and the third retardation layer 568 on the top surface of the sensor 570 facing the back cover 565. The second retardation layer 555 and the third retardation layer 568 may have the same optical characteristics as the first retardation layer 540. The second polarization layer 567 may have the same optical characteristics as the first polarization layer 530.

According to an embodiment, the second retardation layer 555 and the third retardation layer 568 may have a characteristic of a quarter wave retarder (a λ/4 retarder). The second retardation layer 555 may cause a phase change of $(1+4n) \times \lambda/4$ (n is a natural number and λ is a wavelength), and the third retardation layer 568 may cause a phase change of $(1+2n) \times \lambda/4$ (n is a natural number and λ is a wavelength).

FIG. 5A illustrates a change in characteristics of light input from the outside in a process in which the light passes through the display panel 501 and reaches the sensor 570, according to an embodiment.

Referring to FIG. 5A, light input from the outside may pass through the first polarization layer 530 to change into first linearly polarized light 581 that may pass through the first retardation layer 540 to change into circularly polarized light 582 having a characteristic of left-handed circularly polarized light. While FIG. 5A illustrates the circularly polarized light 582 as left-handed circularly polarized light, the circularly polarized light 582 may also be right-handed circularly polarized light. The circularly polarized light 582 may be absorbed into the back cover 565 in an area hidden by the back cover 565.

In an open area 565a not being hidden by the back cover 565, the circularly polarized light 582 may change into second linearly polarized light 583 through the second retardation layer 555, which may prevent the circularly polarized light 582 from being directly input to the second polarization layer 567 to cause light loss.

The second linearly polarized light 583 having passed through the second retardation layer 555 may pass through the second polarization layer 567 without light loss, may change into circularly polarized light 584 through the third retardation layer 568, and may be directed toward a light-receiving part of the sensor 570.

FIG. 5B illustrates a change in characteristics of light generated by the substrate layer 550 when the light is reflected by the sensor 570, according to an embodiment.

Referring to FIG. 5B, back light 591 may be generated by the substrate layer 550 and directed toward the sensor 570 and may scatter in various directions. The back light 591 may be absorbed into the back cover 565 in the area hidden by the back cover 565.

When the back light 591 is reflected by a surface of the sensor 570 and leaks out of the open area 565a not being hidden by the back cover 565, a user may recognize the position of the sensor 570 through the light leakage. To prevent this from occurring, the reflected light generated by the reflection of the back light 591 on the surface of the sensor 570 may be blocked by the second polarization layer 567 and the third retardation layer 568.

The back light 591 may pass through the second retardation layer 555 and the second polarization layer 567 to change into first linearly polarized light 592 that may pass through the third retardation layer 568 to change into circularly polarized light 593 having a characteristic of right-handed circularly polarized light.

The circularly polarized light 593 may be reflected by a surface of the sensor 570 to change into reflected light 594 having a characteristic of left-handed circularly polarized light, unlike the right-handed direction of the circularly polarized light 593.

The reflected light 594 may be re-input to the third retardation layer 568, and may change into second linearly polarized light 595.

The second linearly polarized light 595 may have a different oscillating path than the first linearly polarized light 592, and thus, may be blocked when input to the second polarization layer 567.

Figure 6A:
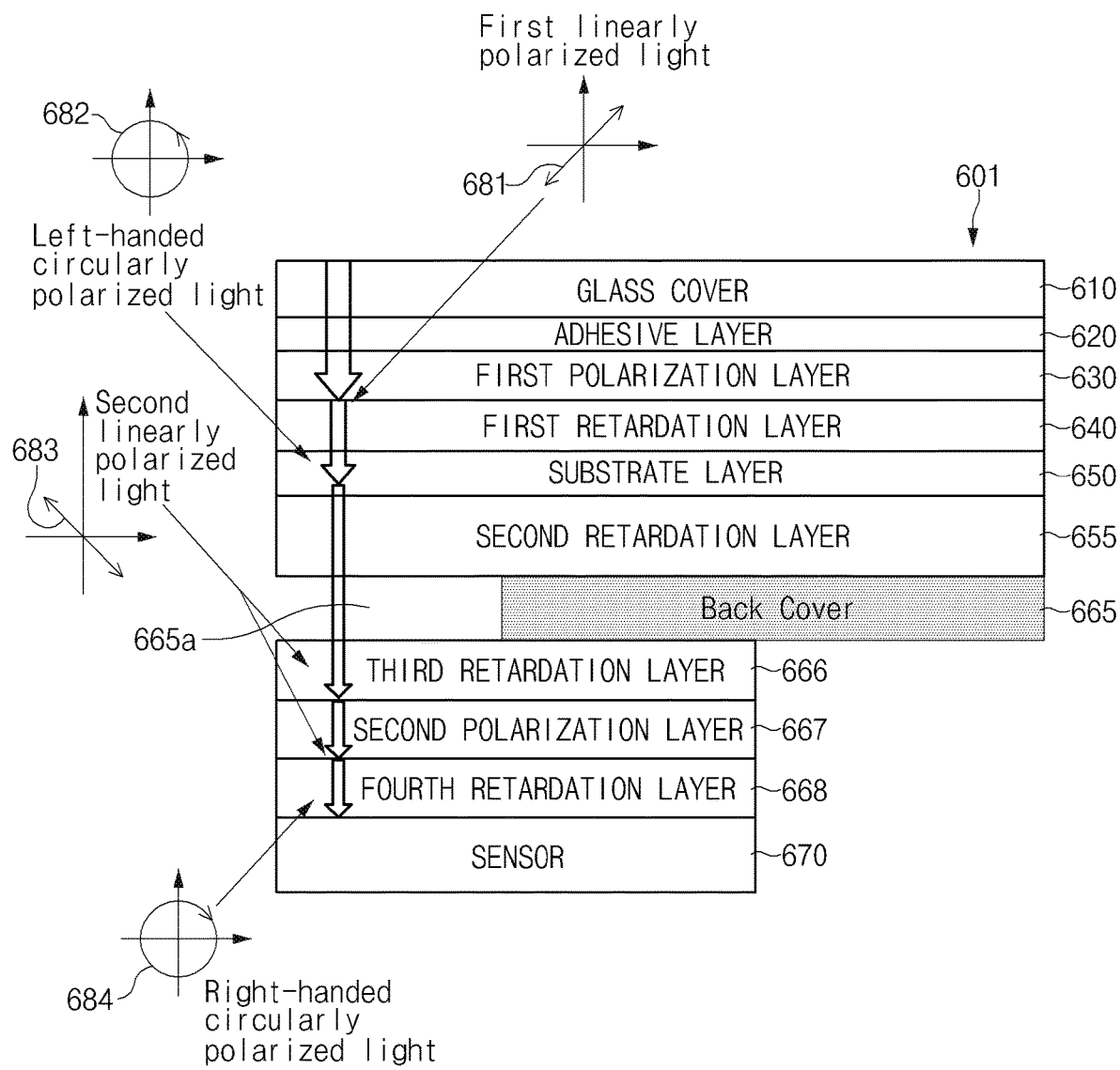
FIGS. 6A and 6B illustrate a display panel additionally including a polarization layer and a retardation layer between a substrate layer and a sensor according to an embodiment.
Figure 6B:
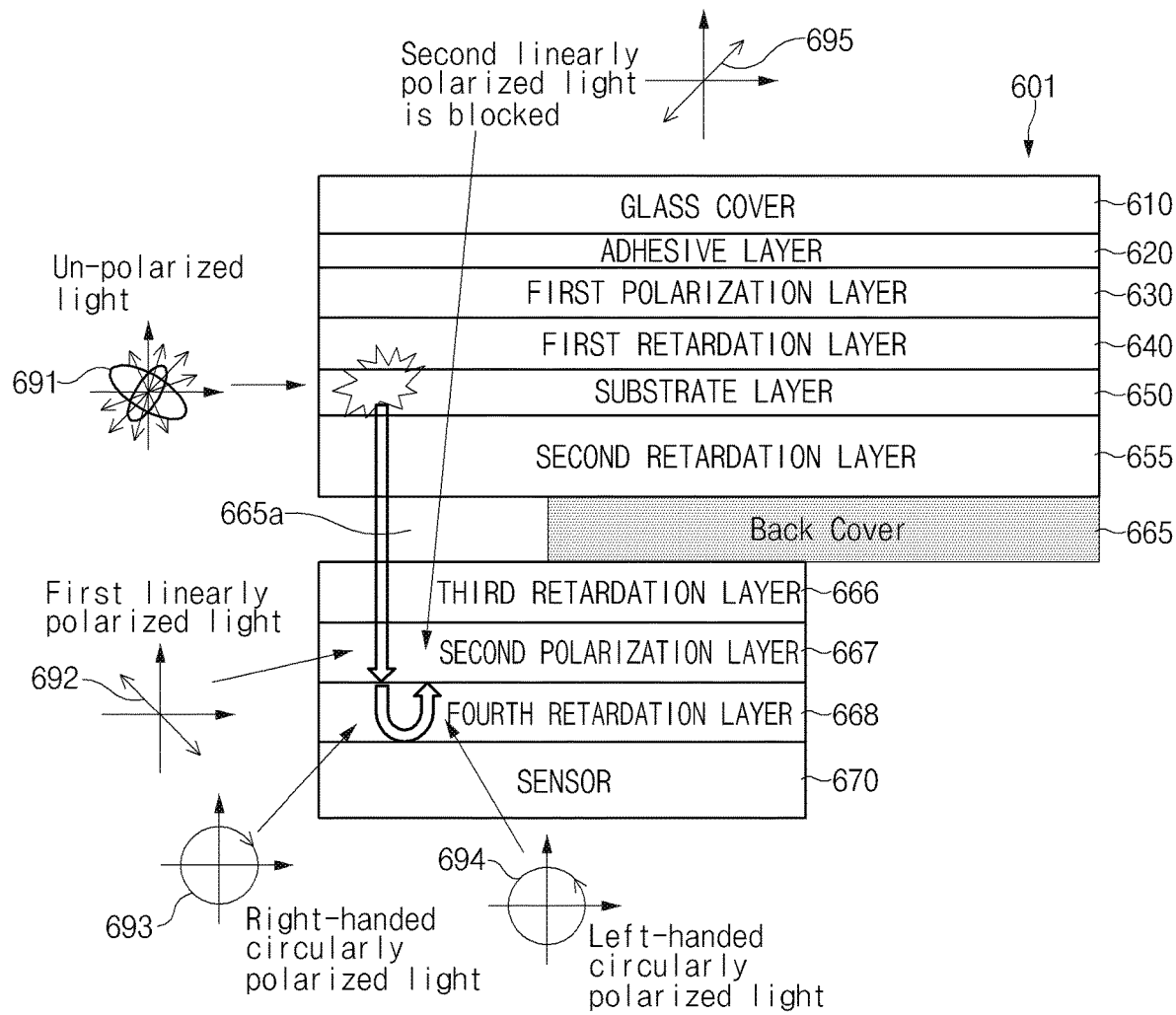

FIGS. 6A and 6B illustrate a display panel additionally including a polarization layer and a retardation layer between a substrate layer and a sensor according to an embodiment. Referring to FIGS. 6A and 6B, the display panel 601 may include a glass cover 610, an adhesive layer 620, a first polarization layer 630, a first retardation layer 640, a substrate layer (or an emissive layer) 650, a second retardation layer 655, and a back cover 665. Characteristics of the glass cover 610, the adhesive layer 620, the first polarization layer 630, the first retardation layer 640, and the substrate layer 650 may be the same as, or similar to, those of the corresponding elements of FIGS. 2A and 2B. Characteristics of the back cover 665 may be the same as, or similar to, those of the back cover 465 of FIGS. 4A and 4B.

Unlike the display panel 501 of FIGS. 5A and 5B, the display panel 601 may include a third retardation layer 666, a second polarization layer 667, and a fourth retardation layer 668 on the top surface of a sensor 670 (the surface facing the back cover 665). The fourth retardation layer 668 may have the same optical characteristics as the first retardation layer 640. The second polarization layer 667 may have the same optical characteristics as the first polarization layer 630.

The second retardation layer 655 and the third retardation layer 666 may have different optical characteristics than the fourth retardation layer 668. When combined, the second retardation layer 655 and the third retardation layer 666 may have the same optical characteristics as the fourth retardation layer 668. For example, the fourth retardation layer 668 may have a characteristic of a quarter wave retarder (a λ/4 retarder), and when their characteristics are combined, the second retardation layer 655 and the third retardation layer 666 may have a characteristic of a quarter wave retarder (a λ/4 retarder).

When combined, the second retardation layer 655 and the third retardation layer 666 may cause a phase change of $(1+4n)\times\lambda/4$ (n is a natural number and λ is a wavelength), and the fourth retardation layer 668 may cause a phase change of $(1+2n)\times\lambda/4$ (n is a natural number and λ is a wavelength).

FIG. 6A illustrates a change in characteristics of light input from the outside in a process in which the light passes through the display panel 601 and reaches the sensor 670, according to an embodiment.

Referring to FIG. 6A, light input from the outside may pass through the first polarization layer 630 to change into first linearly polarized light 681 that may pass through the first retardation layer 640 to change into left-handed circularly polarized light 682. Alternatively, the circularly polarized light 682 may be right-handed circularly polarized light. The circularly polarized light 682 may be absorbed into the back cover 665 in an area hidden by the back cover 665.

In an open area 665a not being hidden by the back cover 665, the circularly polarized light 682 may change into second linearly polarized light 683 through the second retardation layer 655 and the third retardation layer 666, which may be configured such that the sum of phase differences of light passing through the second retardation layer 655 and the third retardation layer 666 is equal to λ/4 or $(1+4n)\times\lambda/4$ (n is a natural number and λ is a wavelength).

The linearly polarized light 683 having passed through the second retardation layer 655 and the third retardation layer 666 may pass through the second polarization layer 667 without light loss, may change into circularly polarized light 684 through the fourth retardation layer 668, and may be directed toward a light-receiving part of the sensor 670.

FIG. 6B illustrates a change in characteristics of light generated by the substrate layer 650 when the light is reflected by the sensor 670, according to an embodiment.

Referring to FIG. 6B, back light 691 may be generated by the substrate layer 650 and directed toward the sensor 670, may scatter in various directions, and may be absorbed into the back cover 665 in the area hidden by the back cover 665.

When the back light 691 is reflected by a surface of the sensor 670 and leaks out of the open area 665a not being hidden by the back cover 665, a user may recognize the position of the sensor 670 through the light leakage. To prevent this from occurring, the reflected light generated by the reflection of the back light 691 on the surface of the sensor 670 may be blocked by the second polarization layer 667 and the fourth retardation layer 668.

The back light 691 may pass through the second retardation layer 655, the third retardation layer 666, and the second polarization layer 667 and change into first linearly polarized light 692.

The first linearly polarized light 692 may pass through the fourth retardation layer 668 to change into circularly polarized light 693 having a characteristic of right-handed circularly polarized light.

The circularly polarized light 693 may be reflected by a surface of the sensor 670 to change into reflected light 694 having a characteristic of left-handed circularly polarized light, unlike the right-handed direction of the circularly polarized light 693.

The reflected light 694 may be re-input to the fourth retardation layer 668, and may change into second linearly polarized light 695.

The second linearly polarized light 695 may have a different oscillating path than the first linearly polarized light 692, and may be blocked when input to the second polarization layer 667.

Figure 7:
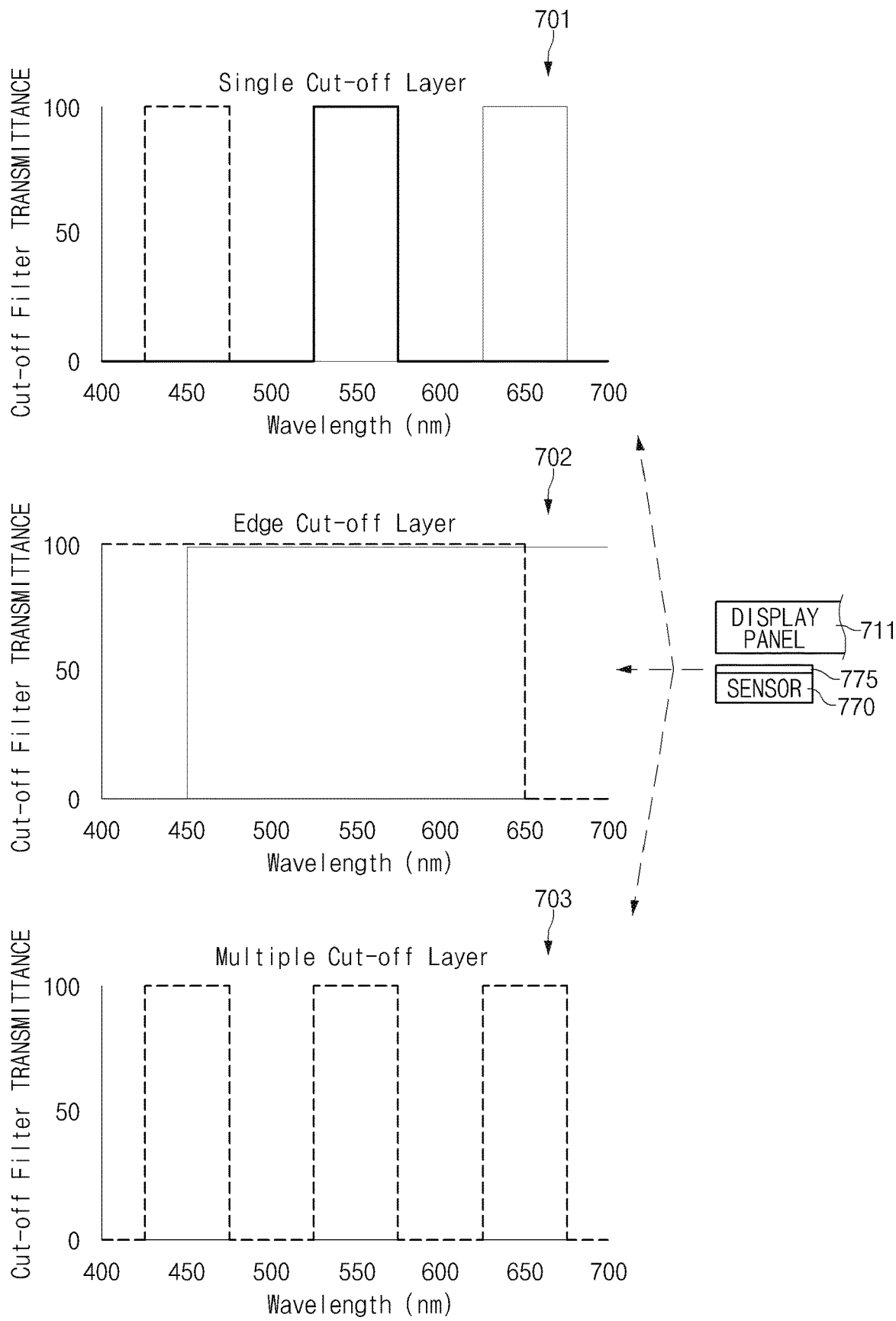
FIG. 7 illustrates graphs representing adjustment of reflectivity using a cut-off layer on a sensor according to an embodiment.

FIG. 7 illustrates graphs representing adjustment of reflectivity using a cut-off layer on a sensor, according to an embodiment.

Referring to FIG. 7, when a sensor 770 is disposed below a display panel 711, an electronic device may block at least a portion of light collected by a light-receiving part of the sensor 770 by using a cut-off layer 705. Accordingly, it is possible to lower the reflectivity of light reflected by a surface of the sensor 770 and to reduce reflected light transmitted to the outside, thereby improving visibility. The cut-off layer 705 may be mounted between a substrate layer inside the display panel 711 and the top surface of the sensor 770.

In a transmittance graph 701, the cut-off layer 705 may operate in a single cut-off manner. For example, the cut-off layer 705 may block the remaining wavelength band other than a specified band around 450 nm or 550 nm.

In a transmittance graph 702, the cut-off layer 705 may operate in an edge cut-off manner. For example, the cut-off layer 705 may block a wavelength band below 450 nm or above 650 nm.

In a transmittance graph 703, the cut-off layer 705 may operate in a multiple cut-off manner. For example, the cut-off layer 705 may block the remaining wavelength band other than a specified band around 450 nm, a specified band around 550 nm, and a specified band around 650 nm.

Figure 8:
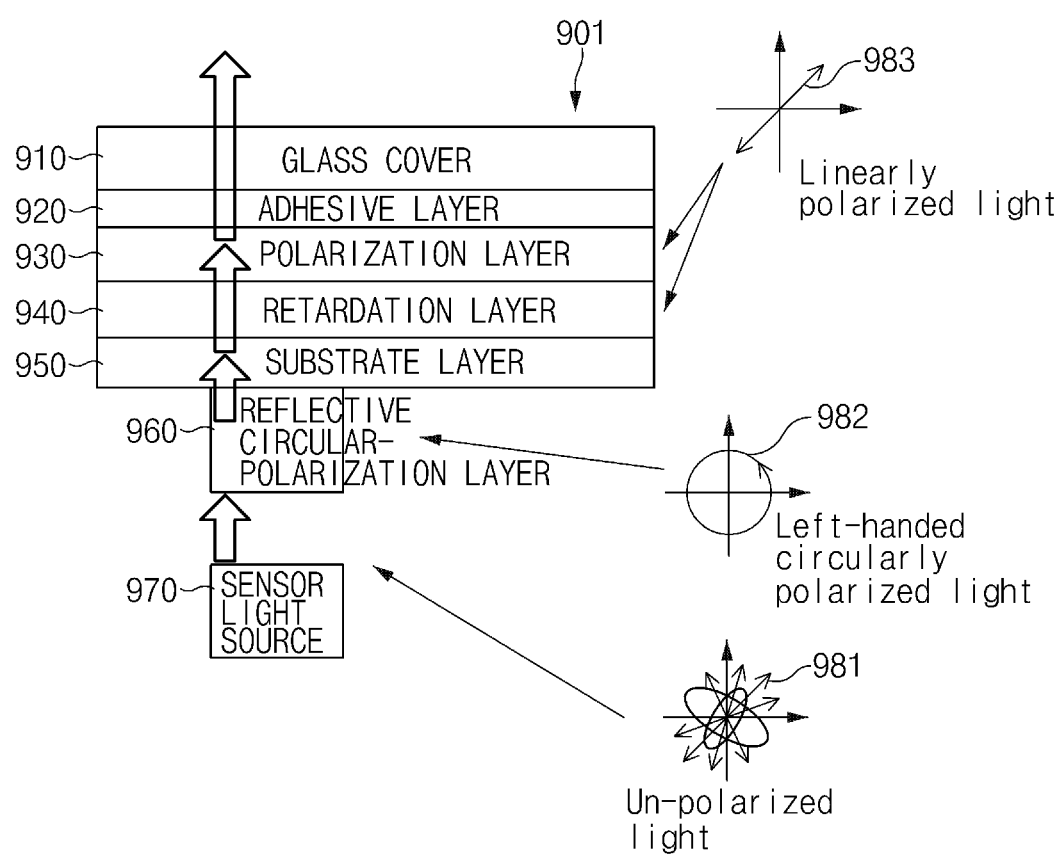
FIG. 8 illustrates a process of outputting light from a light source of a sensor on a rear surface of a display panel according to an embodiment.

FIG. 8 illustrates a process of outputting light from a light source of a sensor on a rear surface of a display panel, according to an embodiment.

Referring to FIG. 8, a display panel 901 may include a glass cover 910, an adhesive layer 920, a polarization layer 930, a retardation layer 940, a substrate layer (or an emissive layer) 950, and a reflective circular-polarization layer 960. Characteristics of the glass cover 910, the adhesive layer 920, the polarization layer 930, the retardation layer 940, and the substrate layer 950 may be the same as, or similar to, those of the corresponding elements of FIGS. 2A and 2B.

A sensor light source 970 may be disposed below the reflective circular-polarization layer 960. The sensor light source 970 may output Tx light 981 that scatters in various directions. The Tx light 981 may be input to the reflective circular-polarization layer 960.

The reflective circular-polarization layer 960 may change the Tx light 981 into left-handed circularly polarized light 982 through a light cycle without light loss. For example, the reflective circular-polarization layer 960 may be implemented with cholesteric liquid crystal (CLC).

The circularly polarized light 982 may be input to the retardation layer 940. The circularly polarized light 982 may change into linearly polarized light 983 through the retardation layer 940. The polarization layer 930 may pass the linearly polarized light 983 without light loss.

When the transmission (Tx) light 981 generated by the sensor light source 970 is input to the retardation layer 940 without the reflective circular-polarization layer 960, an amount of light output may be reduced to 50%. To prevent the reduction in the amount of light output, the reflective circular-polarization layer 960 may change the Tx light 981 into the left-handed circularly polarized light 982 to increase an amount of light output to the outside.

Although FIG. 8 illustrates that the reflective circular-polarization layer 960 is applied, the present disclosure is not limited thereto. The reflective circular-polarization layer 960 may be replaced with a reflective linear polarizer. For example, the reflective linear polarizer may be a wire-grid pol+λ/4 retarder, or a double bright enhancement film (DBEF)+λ/4 retarder. When the reflective linear polarizer is disposed above the sensor light source 970, a separate retardation layer, such as a λ/4 retarder, may be disposed between the reflective linear polarizer and the retardation layer 940.

Figure 9:
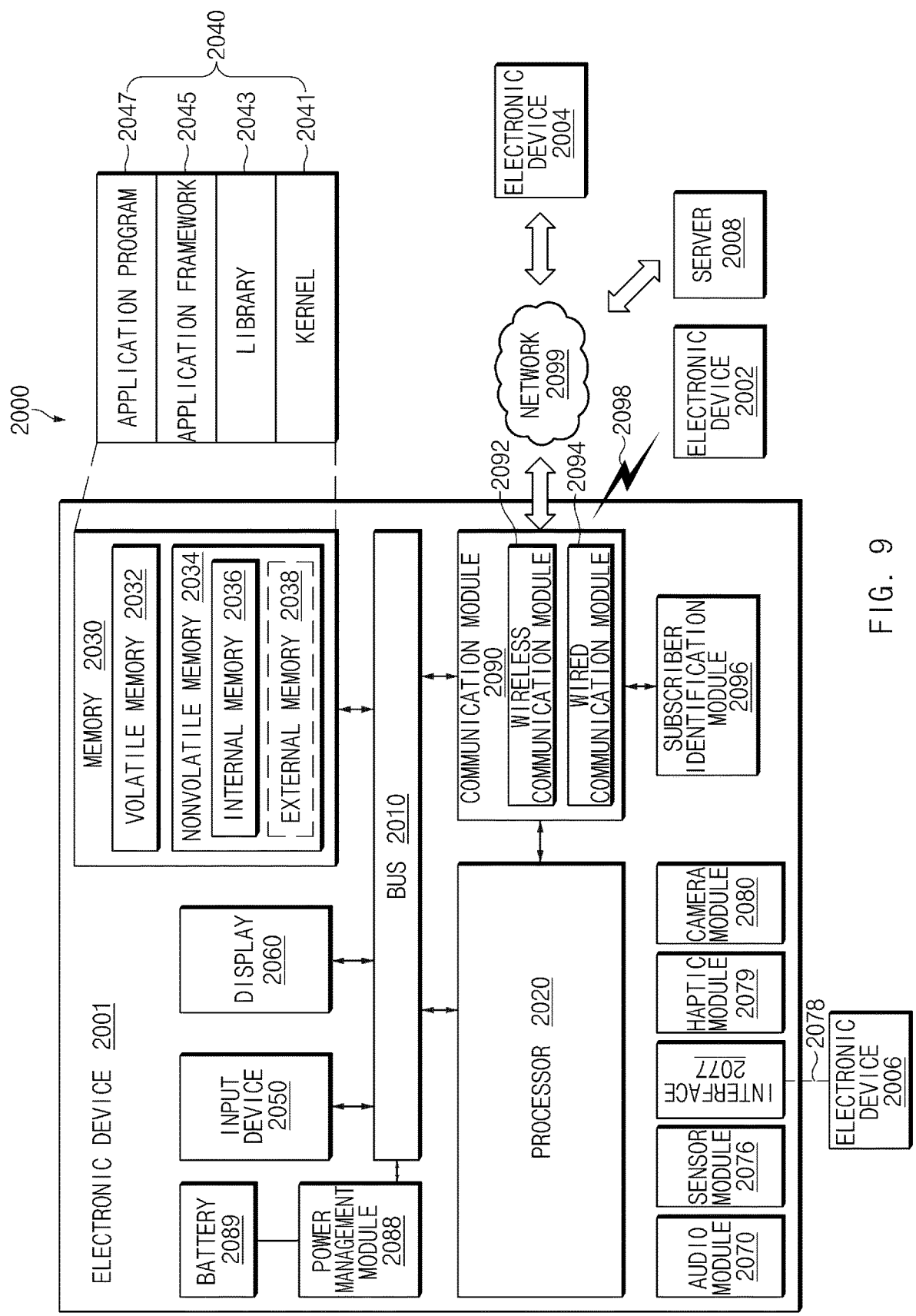
FIG. 9 illustrates a block diagram of an electronic device in a network environment according to an embodiment.

FIG. 9 illustrates a block diagram of an electronic device 2001 in a network environment 2000, according to an embodiment. An electronic device herein may be one of those described above, or may include at least one of televisions (TVs), digital versatile disk (DVD) players, audios, audio accessory devices, such as speakers, headphones, or headsets, refrigerators, air conditioners, cleaners, ovens, microwave ovens, washing machines, air cleaners, set-top boxes, home automation control panels, security control panels, game consoles, electronic dictionaries, electronic keys, camcorders, or electronic picture frames.

In another embodiment, the electronic device may include at least one of navigation devices, global navigation satellite system (GNSS), event data recorders (EDRs), such as a black box for a car, a ship, or a plane, vehicle infotainment devices, such as a head-up display for vehicle, industrial or home robots, drones, automated teller machines (ATMs), points of sales (POS) devices, measuring instruments, such as water, electricity, or gas meters, or Internet of things (IoT) devices, such as light bulbs, sprinkler devices, fire alarms, thermostats, or street lamps.

The electronic device may not be limited to the above-described devices, and may provide functions of a plurality of devices like smartphones which has measurement function of personal biometric information, such as heart rate or blood glucose. Referring to FIG. 9, under the network environment 2000, the electronic device 2001 may communicate with an electronic device 2002 through local wireless communication 2098, may communicate with an electronic device 2004 or a server 2008 through a network 2099, and may communicate with the electronic device 2004 through the server 2008.

The electronic device 2001 may include a bus 2010, a processor 2020, a memory 2030, an input device 2050, such as a microphone or a mouse, a display device 2060, an audio module 2070, a sensor module 2076, an interface 2077, a haptic module 2079, a camera module 2080, a power management module 2088, a battery 2089, a communication module 2090, and a subscriber identification module (SIM) card 2096. According to an embodiment, the electronic device 2001 may not include at least one of the above-described elements or may further include other element(s).

The bus 2010 may interconnect the above-described elements 2020 to 2090 and may include a circuit for conveying a control message or data between the above-described elements. The processor 2020 may include one or more of a CPU, an AP, a graphic processing unit (GPU), an image signal processor (ISP) of a camera or a communication processor (CP), may be implemented with a system on chip (SoC) or a system in package (SiP), may drive an operating system (OS) or an application to control at least one of another element, such as hardware or software element) connected to the processor 2020 and may process and compute various data, may load a command or data, which is received from at least one of other elements, such as the communication module 2090, into a volatile memory 2032 to process the command or data and may store the result data into a nonvolatile memory 2034.

The memory 2030 may include the volatile memory 2032 or the nonvolatile memory 2034. The volatile memory 2032 may include a random access memory (RAM), such as a dynamic RAM (DRAM), a static RAM (SRAM), or a synchronous DRAM (SDRAM). The nonvolatile memory 2034 may include an one time programmable read-only memory (OTPROM), a programmable read-only memory (PROM), an erasable PROM (EPROM), an electrically EPROM (EEPROM), a mask ROM, a flash ROM, a flash memory, a hard disk drive (HDD), or a solid-state drive (SSD), and may be configured in the form of an internal memory 2036 or an external memory 2038 which is available through connection if necessary, according to the connection with the electronic device 2001. The external memory 2038 may further include a flash drive such as compact flash (CF), secure digital (SD), micro secure digital (Micro-SD), mini secure digital (Mini-SD), extreme digital (xD), a multimedia card (MMC), or a memory stick, and may be operatively or physically connected with the electronic device 2001 in a wired manner, such as a cable or a universal serial bus (USB), or a wireless manner, such as by Bluetooth®.

For example, the memory 2030 may store at least one different software element, such as a command or data associated with the program 2040, of the electronic device 2001. The program 2040 may include a kernel 2041, a library 2043, an application framework 2045 and an application program (or "applications") 2047.

The input device 2050 may include a microphone, a mouse, or a keyboard that may be physically connected or a virtual keyboard displayed through the display 2060.

The display 2060 may include a display, a hologram device or a projector, and a control circuit to control a relevant device, and may be an LCD, a LED display, an OLED display, a MEMS display, or an electronic paper display. The display may be flexibly, transparently, or wearably implemented, may include touch circuitry that can detect a user's input such as a gesture input, a proximity input, or a hovering input or a pressure sensor (interchangeably, a force sensor) which is able to measure the intensity of the pressure by the touch. The touch circuit or the pressure sensor may be implemented integrally with the display or with at least one sensor separately from the display. The hologram device may display a stereoscopic image in a space using interference of light. The projector may project light onto a screen to display an image. The screen may be located inside or outside the electronic device 2001.

The audio module 2070 may convert from a sound into an electrical signal or from an electrical signal into the sound, and may acquire sound through the input device 2050, such as a microphone or may output sound through an output device such as a speaker or a receiver, included in the electronic device 2001, an external electronic device 2002, such as a wireless speaker or a wireless headphone, or an electronic device 2006, such as a wired speaker or a wired headphone, connected with the electronic device 2001.

The sensor module 2076 may measure or detect an internal operating state, such as power or temperature of the electronic device 2001 or an external environment state, such as altitude, humidity, or brightness, to generate an electrical signal or a data value corresponding to the information of the measured state or the detected state. The sensor module 2076 may include at least one of a gesture sensor, a gyro sensor, a barometric pressure sensor, a magnetic sensor, an acceleration sensor, a grip sensor, a proximity sensor, a color sensor, such as a red, green, blue (RGB) sensor, an infrared sensor, a biometric sensor, such as an iris sensor, a fingerprint senor, a heartbeat rate monitoring (HRM) sensor, an e-nose sensor, an electromyography (EMG) sensor, an electroencephalogram (EEG) sensor, or an electrocardiogram (ECG) sensor, a temperature sensor, a humidity sensor, an illuminance sensor, or an UV sensor. The sensor module 2076 may further include a control circuit for controlling at least one or more sensors included therein, and may be controlled by using the processor 2020 or a processor, such as a sensor hub that is separate from the processor 2020. When the sensor hub is used, while the processor 2020 is in a sleep state, the separate processor may operate without awakening the processor 2020 to control at least a portion of the operation or the state of the sensor module 2076.

The interface 2077 may include a high definition multimedia interface (HDMI), a universal serial bus (USB), an optical interface, a recommended standard 232 (RS-232), a D-subminiature (D-sub), a mobile high-definition link (MHL) interface, SD card/MMC interface, or an audio interface. A connector 2078 may physically connect the electronic device 2001 and the electronic device 2006. The connector 2078 may include a USB connector, an SD card/MMC connector, or an audio connector, such as a headphone connector.

The haptic module 2079 may convert an electrical signal into mechanical stimulation, such as vibration or motion, or into electrical stimulation. For example, the haptic module 2079 may apply tactile or kinesthetic stimulation to a user, and may include a motor, a piezoelectric element, or an electric stimulator.

The camera module 2080 may capture a still image and a moving picture and may include at least one lens, such as a wide-angle lens and a telephoto lens, or a front lens and a rear lens, an image sensor, an image signal processor, or a flash, such as a light emitting diode or a xenon lamp.

The power management module 2088, which is to manage the power of the electronic device 2001, may constitute at least a portion of a power management integrated circuit (PMIC).

The battery 2089 may include a primary cell, a secondary cell, or a fuel cell and may be recharged by an external power source to supply power to at least one element of the electronic device 2001.

The communication module 2090 may establish a communication channel between the electronic device 2001 and an external device, such as the first external electronic device 2002, the second external electronic device 2004, or the server 2008, may support wired communication or wireless communication through the established communication channel, may include a wireless communication module 2092 or a wired communication module 2094, and may communicate with the external device, such as the first external electronic device 2002, the second external electronic device 2004, or the server 2008, through a first network 2098 (e.g. a wireless local area network such as Bluetooth® or Infrared Data Association (IrDA) or a second network 2099, such as a wireless wide area network, through a relevant module among the wireless communication module 2092 or the wired communication module 2094.

The wireless communication module 2092 may support cellular communication, local wireless communication, and global navigation satellite system (GNSS) communication. The cellular communication may include long-term evolution (LTE), LTE advanced (LTE-A), code division multiple access (CMA), wideband CDMA (WCDMA), universal mobile telecommunications system (UMTS), wireless broadband (WiBro), or global system for mobile communications (GSM). The local wireless communication may include wireless fidelity (Wi-Fi), WiFi Direct, light fidelity (Li-Fi), Bluetooth®, Bluetooth low energy (BLE), Zigbee®, near field communication (NFC), magnetic secure transmission (MST), radio frequency (RF), or a body area network (BAN). The GNSS may include at least one of a global positioning system (GPS), a global navigation satellite system (Glonass), Beidou navigation satellite system (Beidou), or the European global satellite-based navigation system (Galileo), for example. In the present disclosure, "GPS" and "GNSS" may be interchangeably used.

According to an embodiment, when the wireless communication module 2092 supports cellar communication, the wireless communication module 2092 may identify or authenticate the electronic device 2001 within a communication network using the subscriber identification module (SIM) card 2096, and may include a CP separate from the processor 2020, such as an AP. In this case, the communication processor may perform at least a portion of functions associated with at least one of elements 2010 to 2096 of the electronic device 2001 in place of the processor 2020 when the processor 2020 is in an inactive (sleep) state, and together with the processor 2020 when the processor 2020 is in an active state. The wireless communication module 2092 may include a plurality of communication modules, each supporting only a relevant communication scheme among cellular communication, local wireless communication, or a GNSS communication.

The wired communication module 2094 may include a local area network (LAN) service, a power line communication, or a plain old telephone service (POTS).

For example, the first network 2098 may employ WiFi direct or Bluetooth® for transmitting or receiving commands or data through wireless direct connection between the electronic device 2001 and the first external electronic device 2002. The second network 2099 may include a telecommunication network, such as a computer network including a LAN or a WAN, the Internet or a telephone network, for transmitting or receiving commands or data between the electronic device 2001 and the second electronic device 2004.

According to embodiments, the commands or the data may be transmitted or received between the electronic device 2001 and the second external electronic device 2004 through the server 2008 connected with the second network 2099. Each of the first and second external electronic devices 2002 and 2004 may be a device of which the type is different from or the same as that of the electronic device 2001. All or a part of operations that the electronic device 2001 will perform may be executed by another or a plurality of electronic devices, such as the electronic devices 2002 and 2004 or the server 2008. When the electronic device 2001 executes any function or service automatically or in response to a request, the electronic device 2001 may not perform the function or the service internally, but may alternatively or additionally transmit requests for at least a part of a function associated with the electronic device 2001 to any other device, such as the electronic device 2002 or 2004 or the server 2008, which may execute the requested function or additional function and may transmit the execution result to the electronic device 2001. The electronic device 2001 may provide the requested function or service using the received result or may additionally process the received result to provide the requested function or service. To this end cloud, distributed, or client-server computing may be used.

According to embodiments as described above, an electronic device includes a housing, a display panel having at least a portion exposed through the housing, and an image sensor disposed adjacent to an inner surface of the display panel, wherein the display panel includes a first polarization layer configured to cause light input from the outside to oscillate in a first direction in the form of first linearly-polarized light, a first retardation layer disposed below the first polarization layer and configured to cause at least a portion of the first linearly-polarized light to oscillate in the form of circularly-polarized light, a substrate layer disposed below the first retardation layer and configured to pass at least a portion of the circularly-polarized light, and a protection layer disposed below the substrate layer and configured to protect at least a portion of the substrate layer, and wherein the protection layer makes the circularly-polarized light and reflected light generated by reflection of at least a portion of the circularly-polarized light on a surface of the image sensor substantially the same in phase.

The first retardation layer causes the reflected light input through the protection layer and the substrate layer to oscillate in a second direction as second linearly-polarized light.

The first polarization layer blocks leakage of the second linearly-polarized light from the electronic device to the outside.

The protection layer is implemented with one or more isotropic films.

The isotropic films are at least one of a COF, TAC, and zero acryl.

The protection layer is implemented with one or more anisotropic films and causes the circularly-polarized light and the reflected light to have a phase difference of a multiple of one-half wavelength.

The protection layer compensates for a phase difference that occurs in the substrate layer and includes a first protection layer and a second protection layer, and the first protection layer and the second protection layer have different light-transmittance characteristics.

The first protection layer is implemented with one or more isotropic films, and the second protection layer is implemented with one or more anisotropic films.

The second protection layer compensates for a phase difference that occurs in the first protection layer.

The first protection layer and the second protection layer are implemented with one or more isotropic films having different light-transmittance characteristics.

The display panel further includes a second retardation layer disposed below the protection layer and configured to cause the circularly-polarized light to oscillate in the first direction as second linearly-polarized light, a second polarization layer disposed below the second retardation layer and configured to pass the second linearly-polarized light, and a third retardation layer disposed below the second polarization layer and configured to cause the second linearly-polarized light having passed through the second polarization layer to oscillate as circularly-polarized light.

The third retardation layer makes contact with an upper surface of the image sensor and causes light generated by the substrate layer and reflected by a portion of the surface of the image sensor to oscillate in a second direction as third linearly-polarized light.

The second polarization layer blocks leakage of the third linearly-polarized light from the electronic device to the outside.

The protection layer is implemented with a separate retardation layer, and the protection layer and the second retardation layer cause light having passed through the protection layer and the second retardation layer to have a phase lag of a quarter of a wavelength.

The protection layer is implemented with a separate second retardation layer, the protection layer causes the circularly-polarized light to oscillate in the first direction as second linearly-polarized light, and the display panel further includes a second polarization layer disposed below the protection layer and configured to pass the second linearly-polarized light, and a third retardation layer disposed below the second polarization layer and configured to cause the second linearly-polarized light having passed through the second polarization layer to oscillate as circularly-polarized light.

The second retardation layer and the third retardation layer have substantially the same light-transmittance characteristics.

The image sensor includes a light source configured to output light outside the electronic device, and the protection layer is implemented in an area corresponding to the light source by using a reflective circular polarizer or a reflective linear polarizer.

The display panel further includes a light cut-off layer between the display panel and the image sensor, and the light cut-off layer blocks at least a portion of light that is collected by the image sensor.

An electronic device includes a housing, a display panel having at least a portion exposed through the housing, and an image sensor disposed adjacent to an inner surface of the display panel, wherein the display panel includes a first polarization layer configured to cause light input from the outside to oscillate in a first direction as first linearly-polarized light, a first retardation layer disposed below the first polarization layer and configured to cause at least a portion of the first linearly-polarized light to oscillate as first circularly-polarized light, a substrate layer disposed below the first retardation layer and configured to pass at least a portion of the first circularly-polarized light, and a protection layer disposed below the substrate layer and configured to protect at least a portion of the substrate layer, and wherein the protection layer makes the first circularly-polarized light and second circularly-polarized light having passed through the protection layer substantially the same in phase.

An electronic device includes a housing, a display panel having at least a portion exposed through the housing, and an image sensor disposed adjacent to an inner surface of the display panel, wherein the display panel includes a first polarization layer configured to cause light input from the outside to oscillate in a first direction as first linearly-polarized light, a first retardation layer disposed below the first polarization layer and configured to cause at least a portion of the first linearly-polarized light to oscillate as circularly-polarized light, a substrate layer disposed below the first retardation layer and configured to pass at least a portion of the circularly-polarized light, and a protection layer disposed below the substrate layer and configured to protect at least a portion of the substrate layer, and wherein the protection layer causes the circularly-polarized light and reflected light generated by reflection of at least a portion of the circularly-polarized light on a surface of the image sensor to rotate in different directions.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device, comprising:
a housing;
a display panel having at least a portion exposed through the housing; and
a sensor disposed adjacent to an inner surface of the display panel,
wherein the display panel includes:
a first polarization layer configured to cause a light input from an outside of the electronic device to oscillate in a first direction as a first linearly-polarized light;
a first retardation layer disposed below the first polarization layer and configured to cause at least a portion of the first linearly-polarized light to oscillate as a first circularly-polarized light;
a substrate layer disposed below the first retardation layer and configured to pass at least a portion of the first circularly-polarized light; and
a protection layer disposed below the substrate layer and configured to protect at least a portion of the substrate layer by covering the at least a portion of the substrate layer,
wherein the protection layer causes the first circularly-polarized light and a reflected light generated by reflection of the at least a portion of the first circularly-polarized light on a surface of the sensor to be in an identical phase.

2. The electronic device of claim 1, wherein the first retardation layer causes the reflected light input through the protection layer and the substrate layer to oscillate in a second direction as a second linearly-polarized light.

3. The electronic device of claim 2, wherein the first polarization layer blocks a leakage of the second linearly-polarized light from the electronic device to the outside.

4. The electronic device of claim 1, wherein the protection layer is implemented with one or more isotropic films.

5. The electronic device of claim 4, wherein the one or more isotropic films are each at least one of a cyclo olefin polymer, tri-acetyl cellulose, and zero acryl.

6. The electronic device of claim 1, wherein the protection layer compensates for a phase difference that occurs in the substrate layer.

7. The electronic device of claim 1, wherein the protection layer includes a first protection layer and a second protection layer that have different light-transmittance characteristics.

8. The electronic device of claim 7, wherein the first protection layer is implemented with one or more isotropic films, and
wherein the second protection layer is implemented with one or more anisotropic films.

9. The electronic device of claim 8, wherein the second protection layer compensates for a phase difference that occurs in the first protection layer.

10. The electronic device of claim 7, wherein the first protection layer and the second protection layer are each implemented with one or more isotropic films having the different light-transmittance characteristics.

11. The electronic device of claim 1, wherein the display panel further includes:
a second retardation layer disposed below the protection layer and configured to cause the first circularly-polarized light to oscillate in the first direction as a second linearly-polarized light;
a second polarization layer disposed below the second retardation layer and configured to pass the second linearly-polarized light; and
a third retardation layer disposed below the second polarization layer and configured to cause the second linearly-polarized light having passed through the second polarization layer to oscillate as a second circularly-polarized light.

12. The electronic device of claim 11, wherein the third retardation layer makes contact with an upper surface of the sensor.

13. The electronic device of claim 11, wherein the third retardation layer causes the light generated by the substrate layer and reflected by a portion of the surface of the sensor to oscillate in a second direction as a third linearly-polarized light.

14. The electronic device of claim 11, wherein the protection layer is implemented with a separate retardation layer, and
wherein the protection layer and the second retardation layer cause the light having passed through the protection layer and the second retardation layer to have a phase lag of a quarter of a wavelength.

15. The electronic device of claim 1, wherein the protection layer is implemented with a separate second retardation layer,
wherein the protection layer causes the first circularly-polarized light to oscillate in the first direction as a second linearly-polarized light, and
wherein the display panel further includes:
a second polarization layer disposed below the protection layer and configured to pass the second linearly-polarized light; and
a third retardation layer disposed below the second polarization layer and configured to cause the second linearly-polarized light having passed through the second polarization layer to oscillate as a second circularly-polarized light.

16. The electronic device of claim 1, wherein the sensor includes the light source configured to output light outside the electronic device, and
wherein the protection layer is implemented in an area corresponding to the light source by using a reflective circular polarizer or a reflective linear polarizer.

17. The electronic device of claim 1, wherein the display panel further includes a light cut-off layer between the display panel and the sensor, and
wherein the light cut-off layer blocks at least a portion of light that is collected by the sensor.

18. An electronic device, comprising:
a housing;
a display panel having at least a portion exposed through the housing; and a sensor disposed adjacent to an inner surface of the display panel,
wherein the display panel includes:
a first polarization layer configured to cause a light input from an outside of the electronic device to oscillate in a first direction as a first linearly-polarized light;
a first retardation layer disposed below the first polarization layer and configured to cause at least a portion of the first linearly-polarized light to oscillate as a first circularly-polarized light;
a substrate layer disposed below the first retardation layer and configured to pass at least a portion of the first circularly-polarized light; and
a protection layer disposed below the substrate layer and configured to protect at least a portion of the substrate layer by covering the at least a portion of the substrate layer,
wherein the protection layer causes the first circularly-polarized light and a second circularly-polarized light having passed through the protection layer to be in an identical phase.

19. An electronic device, comprising:
a housing;
a display panel having at least a portion exposed through the housing; and
a sensor disposed adjacent to an inner surface of the display panel,
wherein the display panel includes:
a first polarization layer configured to cause a light input from an outside of the electronic device to oscillate in a first direction as a first linearly-polarized light;
a first retardation layer disposed below the first polarization layer and configured to cause at least a portion of the first linearly-polarized light to oscillate as a circularly-polarized light;
a substrate layer disposed below the first retardation layer and configured to pass at least a portion of the circularly-polarized light; and
a protection layer disposed below the substrate layer and configured to protect at least a portion of the substrate layer by covering the at least a portion of the substrate layer, wherein the protection layer causes the circularly-polarized light and a reflected light generated by reflection of the at least a portion of the circularly-polarized light on a surface of the sensor to scatter in different directions.

20. An electronic device, comprising:
a housing;
a display panel having at least a portion exposed through the housing; and
a sensor disposed adjacent to an inner surface of the display panel,
wherein the display panel includes:
a first polarization layer configured to cause a light input from an outside of the electronic device to oscillate in a first direction as a first linearly-polarized light;
a first retardation layer disposed below the first polarization layer and configured to cause at least a portion of the first linearly-polarized light to oscillate as a circularly-polarized light;
a substrate layer disposed below the first retardation layer and configured to pass at least a portion of the circularly-polarized light; and
a protection layer disposed below the substrate layer and configured to protect at least a portion of the substrate layer by covering the at least a portion of the substrate layer,
wherein the protection layer is implemented with one or more anisotropic films and causes the circularly-polarized light and a reflected light generated by reflection of the at least a portion of the circularly-polarized light on a surface of the sensor to have a phase difference of a multiple of one-half wavelength.

* * * * *